United States Patent
Kurosawa et al.

(10) Patent No.: US 7,223,319 B2
(45) Date of Patent: May 29, 2007

(54) SEMICONDUCTOR MANUFACTURING APPARATUS AND METHOD OF MANUFACTURING SEMICONDUCTOR DEVICE

(75) Inventors: Tetsuya Kurosawa, Kanagawa-Ken (JP); Shinya Takyu, Saitama-Ken (JP); Kinya Mochida, Saitama-Ken (JP); Kenichi Watanabe, Saitama-Ken (JP)

(73) Assignees: Kabushiki Kaisha Toshiba, Tokyo (JP); Lintec Corporation, Tokyo (JP)

( * ) Notice: Subject to any disclaimer, the term of this patent is extended or adjusted under 35 U.S.C. 154(b) by 0 days.

(21) Appl. No.: 10/808,298

(22) Filed: Mar. 25, 2004

(65) Prior Publication Data
US 2005/0019980 A1 Jan. 27, 2005

(30) Foreign Application Priority Data
Mar. 26, 2003 (JP) ............................. 2003-085376

(51) Int. Cl.
*B32B 38/10* (2006.01)
(52) U.S. Cl. .................... 156/344; 156/247; 156/250; 156/510; 156/584; 438/464; 438/976
(58) Field of Classification Search ............... 156/344, 156/584, 247, 250, 268, 510; 438/464, 976; 705/26, 27, 37
See application file for complete search history.

(56) References Cited

U.S. PATENT DOCUMENTS

| 3,809,050 A | 5/1974 | Chough et al |
| 4,138,304 A | 2/1979 | Gantley |
| 4,556,362 A | 12/1985 | Bahnck et al. |
| 4,667,944 A | 5/1987 | Althouse |
| 4,778,326 A | 10/1988 | Althouse et al. |
| 4,799,156 A * | 1/1989 | Shavit et al. ............... 705/26 |
| 5,254,201 A | 10/1993 | Konda et al. |
| 5,950,613 A | 9/1999 | Wark et al. |
| 6,083,811 A | 7/2000 | Riding et al. |

(Continued)

FOREIGN PATENT DOCUMENTS

EP  0 488 722 A1  6/1992

(Continued)

OTHER PUBLICATIONS

Austrian Search Report, dated Sep. 22, 2004, issued for Singapore Application No. 200401584-8.

(Continued)

*Primary Examiner*—Mark A. Osele
(74) *Attorney, Agent, or Firm*—Finnegan, Henderson, Farabow, Garrett & Dunner, L.L.P.

(57) ABSTRACT

A semiconductor manufacturing apparatus includes: a peeling mechanism to peel a pressure sensitive adhesive (PSA) tape from a semiconductor wafer constituted by a plurality of semiconductor chips which are separated therefrom, the semiconductor wafer having an element formation surface to form an element thereon and a rear surface opposite to the element formation surface, the PSA tape adhering to the element formation surface of the semiconductor wafer, each of the semiconductor chips having an adhesive layer formed on the rear surface; wherein the peeling mechanism has a sucking section which have a porous member to hold the semiconductor wafer by suction, the porous member being segmented into at least two sucking areas in the direction in which the PSA tape is peeled.

14 Claims, 29 Drawing Sheets

U.S. PATENT DOCUMENTS

| | | |
|---|---|---|
| 6,209,532 B1 | 4/2001 | Arnold et al. |
| 6,220,771 B1 | 4/2001 | Tung et al. |
| 6,260,024 B1 * | 7/2001 | Shkedy ........................ 705/37 |
| 6,297,075 B1 | 10/2001 | Odajima et al. |
| 6,342,434 B1 * | 1/2002 | Miyamoto et al. .......... 438/464 |
| 6,352,073 B1 | 3/2002 | Kurosawa et al. |
| 6,461,942 B2 * | 10/2002 | Watanabe et al. .......... 438/464 |
| 7,060,593 B2 | 6/2006 | Kurosawa et al. |
| 2001/0029064 A1 | 10/2001 | Odajima et al. |
| 2001/0049160 A1 | 12/2001 | Watanabe et al. |
| 2002/0162628 A1 * | 11/2002 | Yamasaki ................... 156/344 |
| 2003/0075849 A1 * | 4/2003 | Choi ........................... 269/21 |
| 2005/0205204 A1 * | 9/2005 | Kurosawa et al. .......... 156/344 |

FOREIGN PATENT DOCUMENTS

| | | |
|---|---|---|
| EP | 1 026 735 A2 | 8/2000 |
| EP | 1 061 566 A2 | 12/2000 |
| JP | 6-114664 | 4/1994 |
| JP | 6-232257 | 8/1994 |
| JP | 10-157851 | 6/1998 |
| JP | 11-45934 | 2/1999 |
| JP | 2000-091281 | 3/2000 |
| JP | 2000-315697 | 11/2000 |
| JP | 2003-86540 | 3/2003 |
| JP | 2003-179126 | 6/2003 |
| KR | 2000-0057915 | 9/2000 |

OTHER PUBLICATIONS

Chinese Office Action issued on Apr. 7, 2006, in Chinese Application No. 200410029644X.

European Search Report issued by the European Patent Office on Sep. 28, 2006, for European Patent Application No. 04007409.8.

* cited by examiner

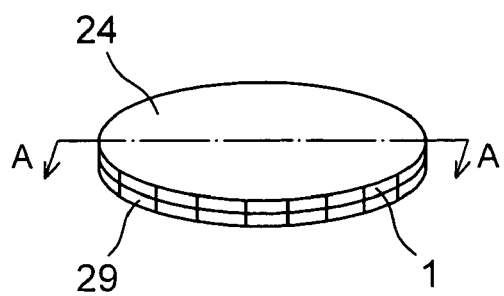
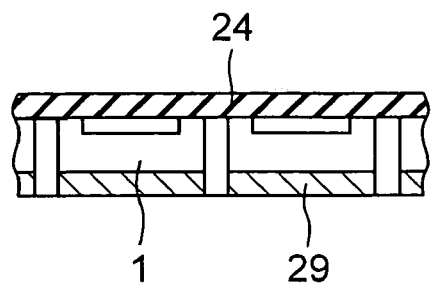
FIG. 1A    FIG. 1B
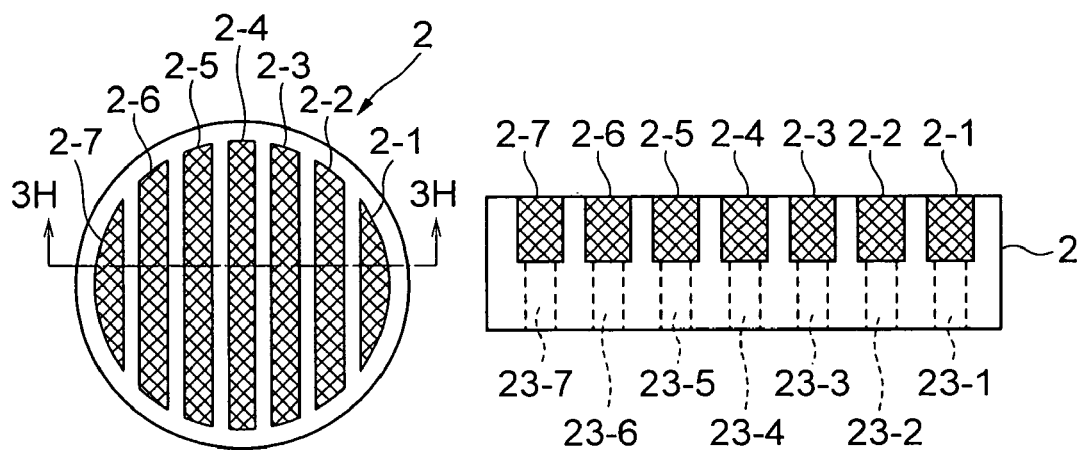
FIG. 3A    FIG. 3B
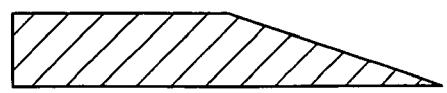
FIG. 6A    FIG. 6B

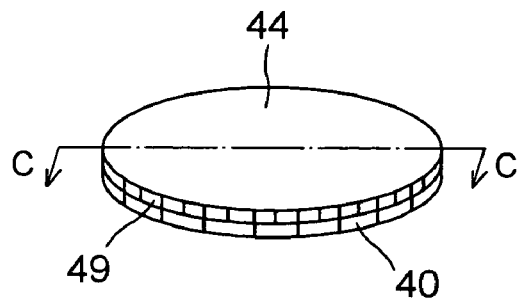
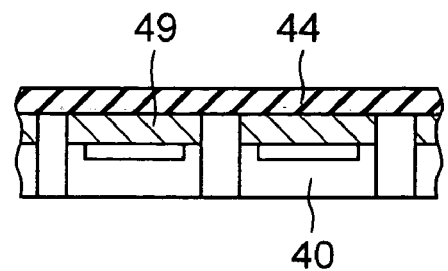
FIG. 16A        FIG. 16B
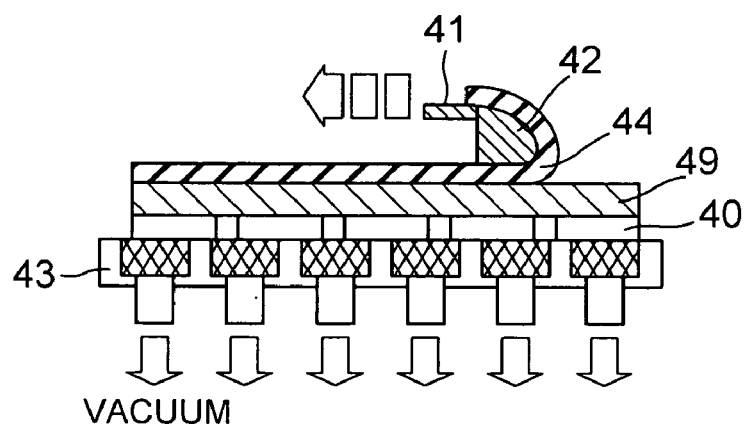
FIG. 17A
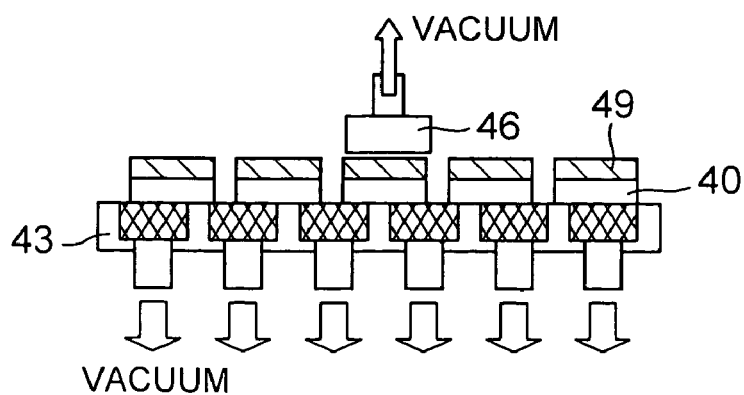
FIG. 17B

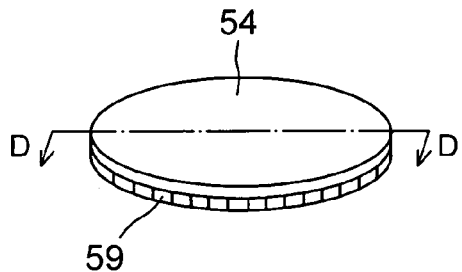
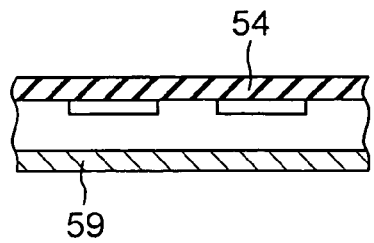
FIG. 18A          FIG. 18B
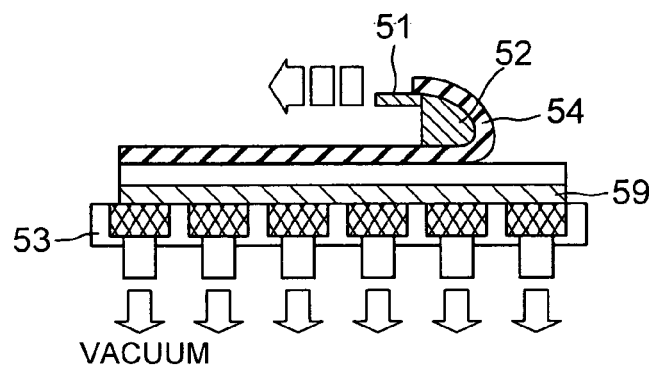
FIG. 19A
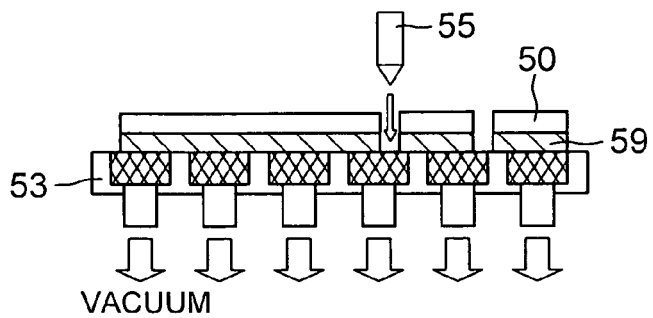
FIG. 19B
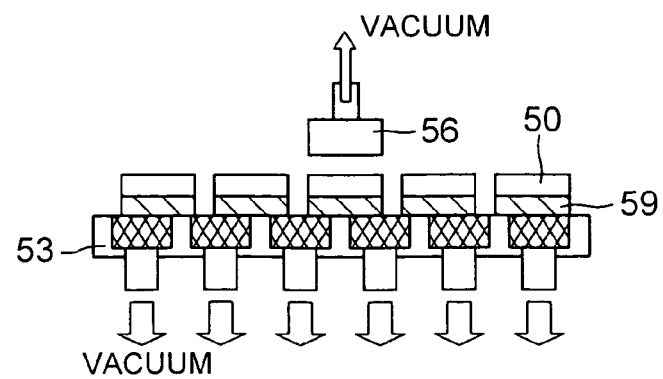
FIG. 19C

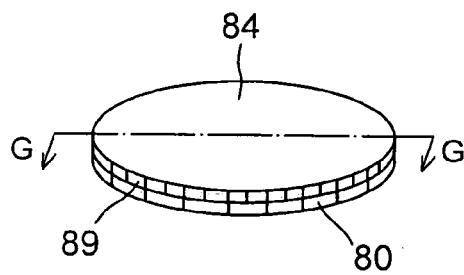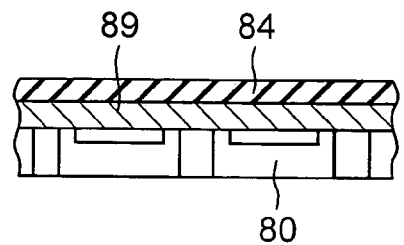
FIG. 24A  FIG. 24B
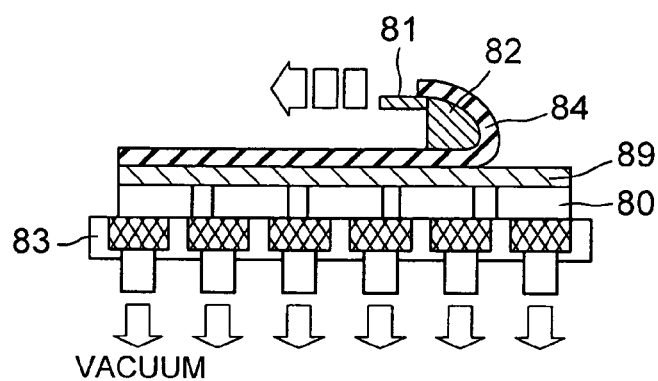
FIG. 25A
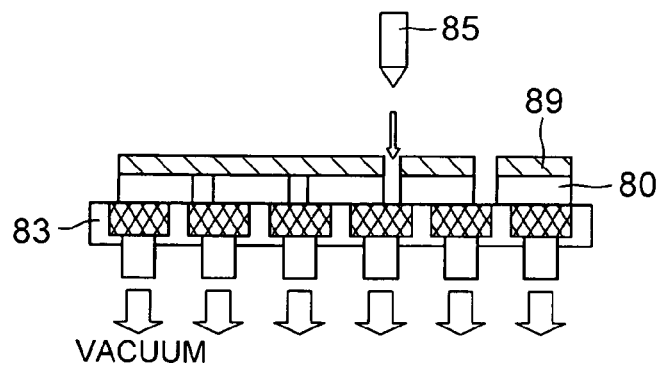
FIG. 25B
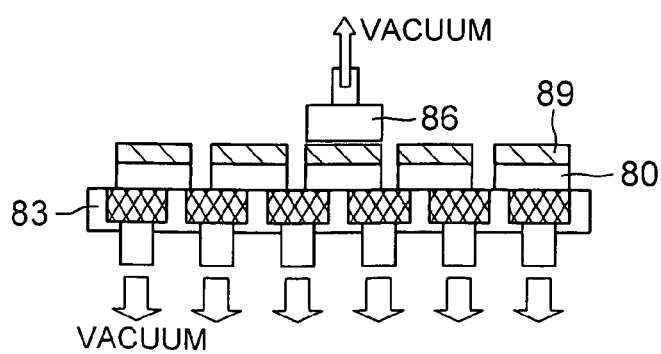
FIG. 25C

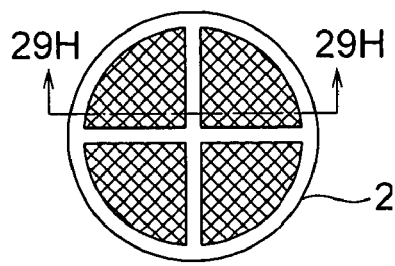 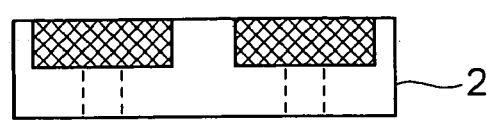
FIG.29A  FIG.29B
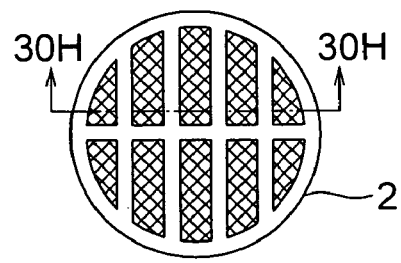 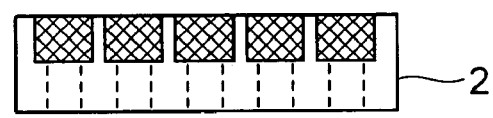
FIG.30A  FIG.30B
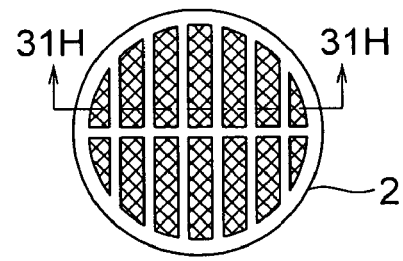 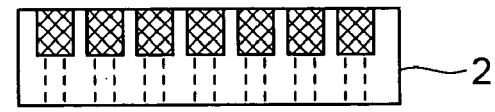
FIG.31A  FIG.31B
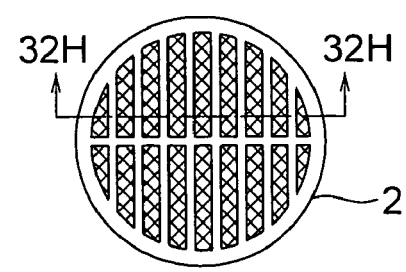 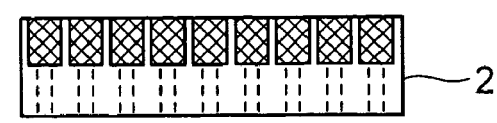
FIG.32A  FIG.32B

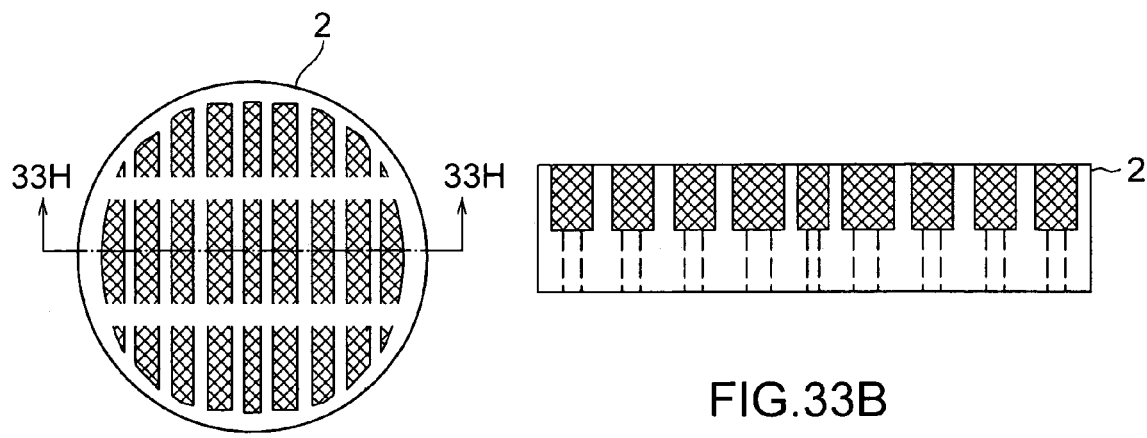
FIG.33A
FIG.33B
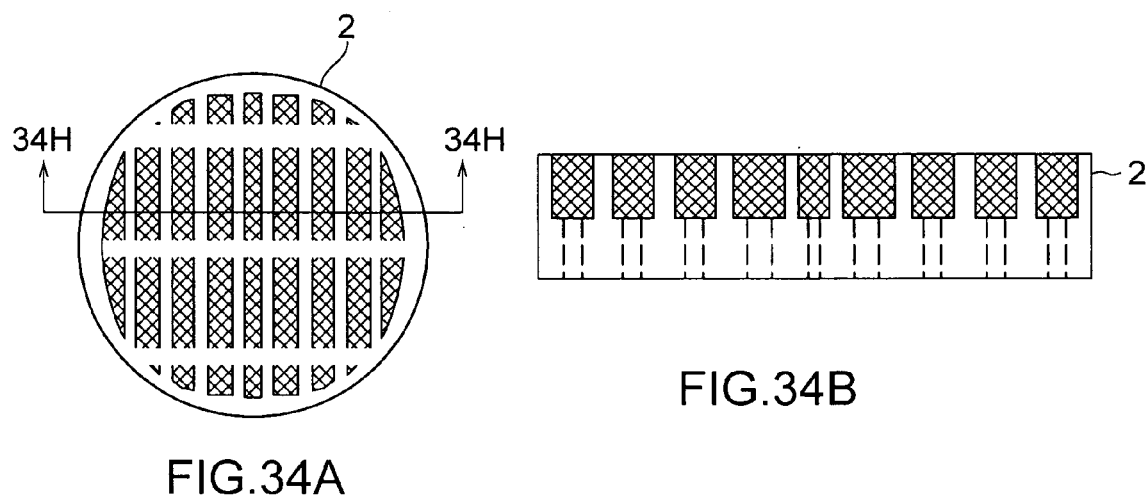
FIG.34A
FIG.34B
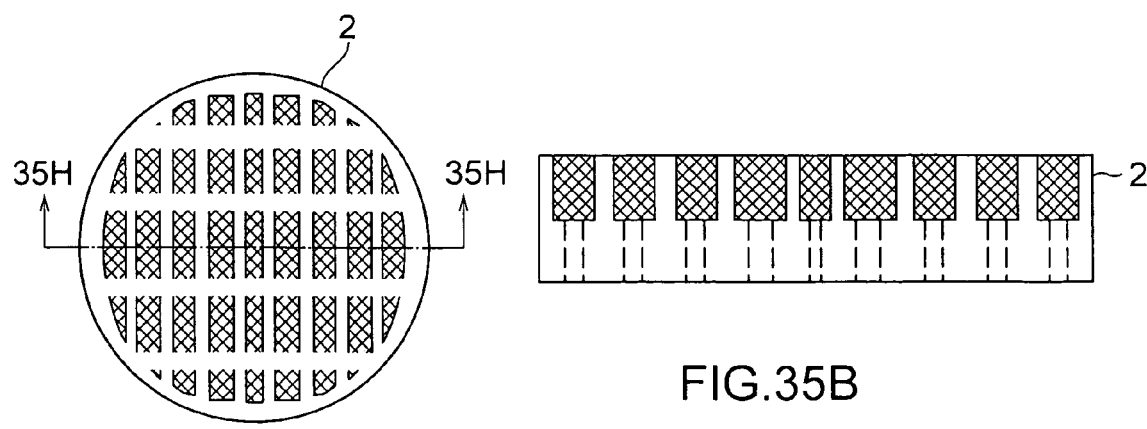
FIG.35A
FIG.35B

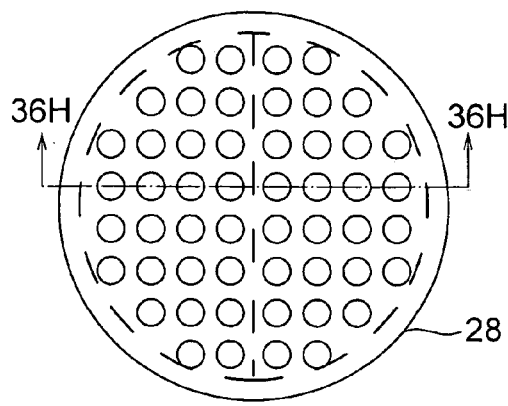
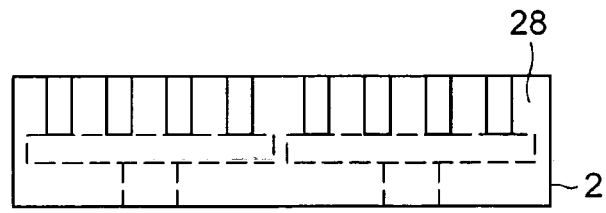
FIG.36B
FIG.36A
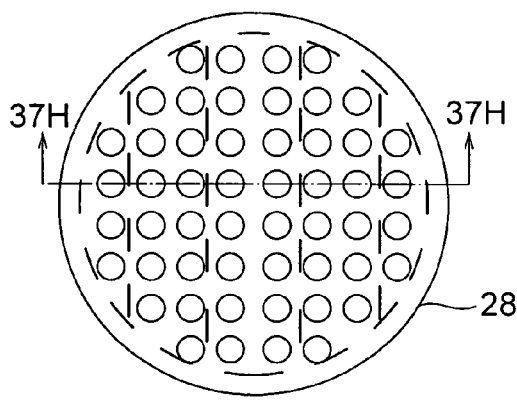
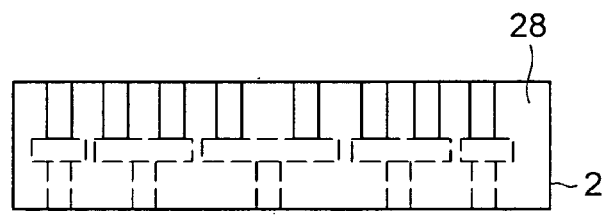
FIG.37B
FIG.37A
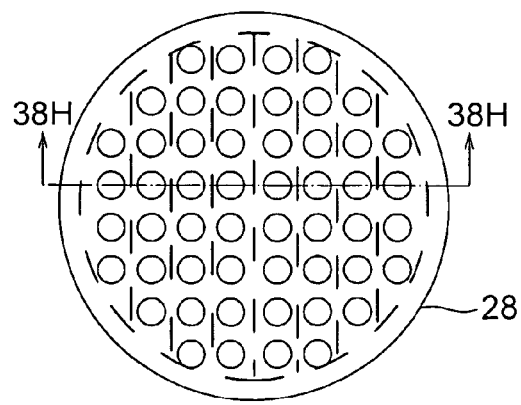
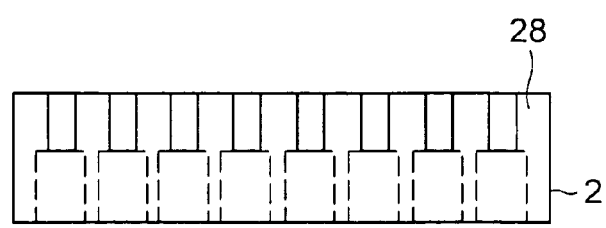
FIG.38B
FIG.38A

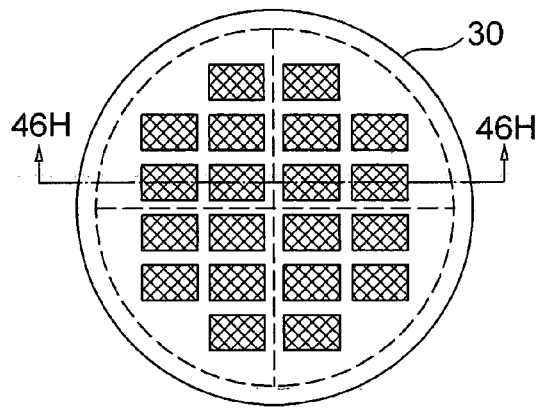
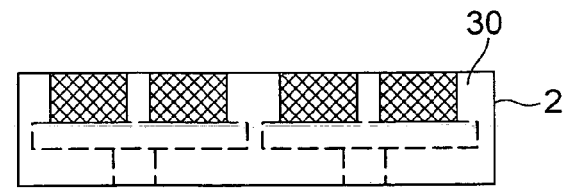
FIG.46B
FIG.46A
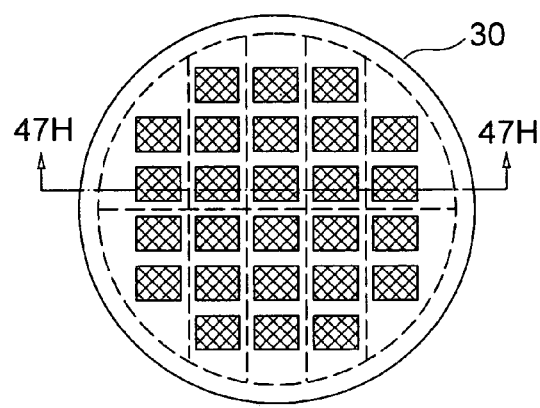
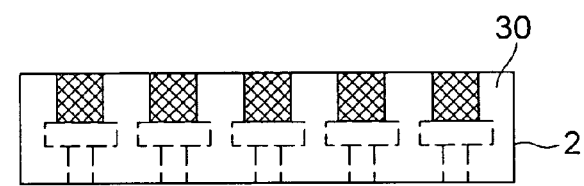
FIG.47B
FIG.47A
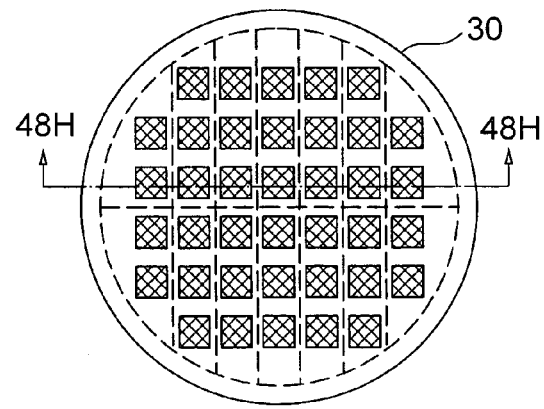
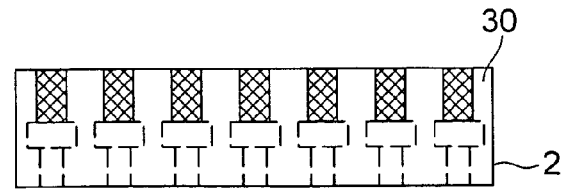
FIG.48B
FIG.48A

AFTER TCT

AFTER TCT

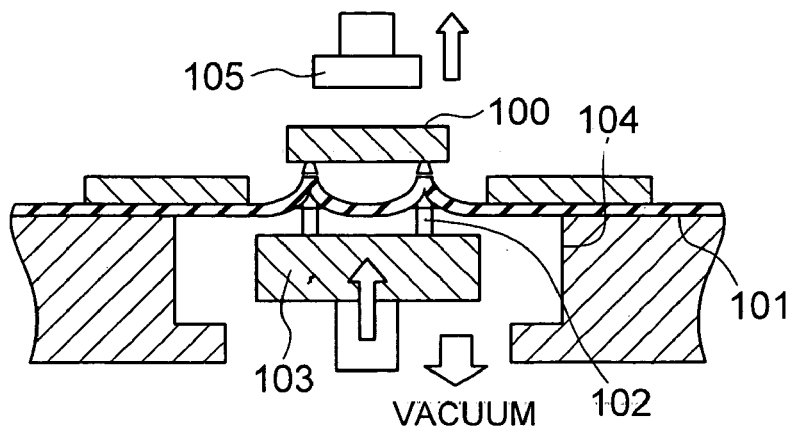
FIG. 55
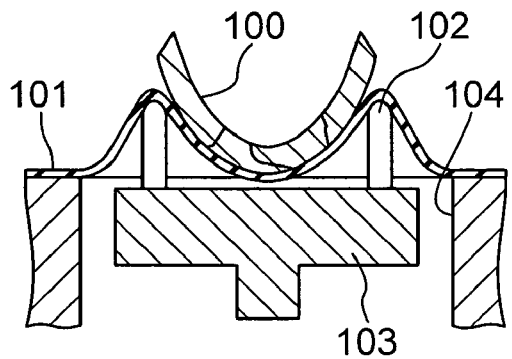 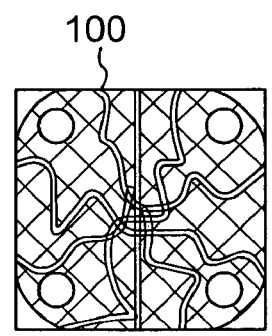
FIG. 56A  FIG. 56B
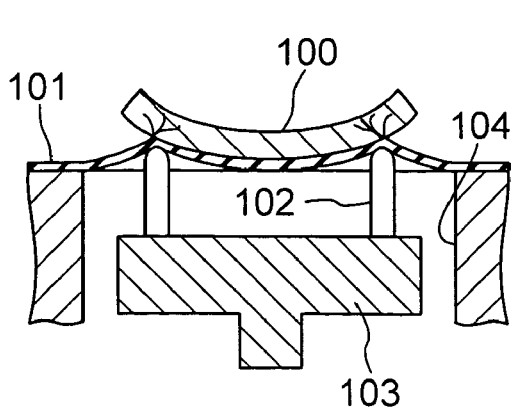 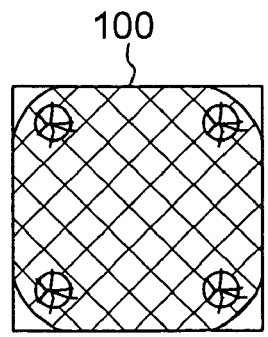
FIG. 57A  FIG. 57B

SEMICONDUCTOR MANUFACTURING APPARATUS AND METHOD OF MANUFACTURING SEMICONDUCTOR DEVICE

CROSS REFERENCE TO RELATED APPLICATION

This application claims benefit of priority under 35USC §119 to Japanese Patent Application No. 2003-85376, filed on Mar. 26, 2003, the contents of which are incorporated by reference herein.

BACKGROUND OF THE INVENTION

1. Field of the Invention

The present invention relates to a semiconductor manufacturing apparatus and a method of manufacturing a semiconductor device. The invention relates, for example, to a semiconductor manufacturing apparatus which comprises a peeling mechanism to peel a pressure sensitive adhesive tape adhering to a semiconductor wafer, and a method of manufacturing a semiconductor device using a semiconductor manufacturing apparatus according to the invention.

2. Related Background Art

Generally in a manufacturing process of a semiconductor device, a semiconductor wafer on which element formation has been finished is divided and separated into pieces along a dicing line or a chip division line, thereby forming a plurality of semiconductor chips. A pressure sensitive adhesive tape (which will be hereinafter referred to as a PSA tape) is affixed to the semiconductor wafer before and after the chip separating process, and the semiconductor chips in the piece form are integrated to keep a wafer shape. The semiconductor wafer, which has thus been broken into a plurality of semiconductor chips and is supported by the PSA tape, is transferred to a mounting process using, for example, a die bonder (refer to FIG. 2). Each semiconductor chip separated from the semiconductor wafer is picked up from the PSA tape, and undergoes a mounting process such as a process of mounting to a leadframe or a TAB tape or a process of sealing into a package, thereby completing the semiconductor device.

When such individual semiconductor chips are picked up, a surface of the semiconductor wafer, opposite to a surface to which the PSA tape is affixed, is affixed to another PSA tape which is affixed to a wafer ring, and then the PSA tape is peeled off, and the wafer ring is mounted to a pickup device to pick up the individual semiconductor chips.

FIG. 55 is an enlarged sectional view of essential components of a conventional pickup device in picking up a semiconductor chip 100 from a PSA tape 101, which is disclosed in Japanese Patent Publication Laid-open No. 2003-17513. When the semiconductor chip 100 is peeled off and picked up from the PSA tape 101 affixed to the wafer ring, thrust pins (or pick-up needles) 102 are pushed up (raised) via the PSA tape 101 from a rear surface side of the semiconductor chip 100, and elasticity of the PSA tape 101 is utilized to peel off the semiconductor chip 100. The thrust pins 102 are disposed at corner portions or positions corresponding to the vicinity of a central portion of the semiconductor chip 100, and the base of the thrust pins 102 are attached to a pin holder 103.

As an order to peel off the semiconductor chip 100 from the PSA tape 101, a holding table, on which the PSA tape 101 to which the semiconductor chip 100 is affixed is fixed, is first moved so that the semiconductor chip 100 to be picked up will be located above the thrust pins 102. Next, for example, detection of a position of the semiconductor chip 100 to be peeled off and mark detection for identification of non-defective/defective products are performed, and an internal portion of a backup holder 104 is sucked by vacuum to cause the PSA tape 101 to be sucked and fixed onto an upper surface of the backup holder 104. In this state, the pin holder 103 to which the thrust pins 102 are mounted is lifted to project the thrust pins 102 from the upper surface of the backup holder 104 and raise the semiconductor chip 100 via the PSA tape 101 from the rear surface side. The raised semiconductor chip 100 is held by a suction collet 105 and supplied to the mounting process.

There has recently been a keen desire for a thinner semiconductor chip, for example, to have the semiconductor chip built in a thin card-shape package, and the thickness of the semiconductor chip is reduced to 100 µm or less by polishing, grinding and etching a rear surface of the semiconductor wafer.

Problems with the cracks which might happen when the thickness of the semiconductor chip is thus reduced to 100 µm or less will be described in more detail referring to FIGS. 56A to FIGS. 57B.

With the thickness of the semiconductor chip being very small as described above, even if an outer peripheral portion (corner portions in particular) of the semiconductor chip 100 comes off from the PSA tape 101, the semiconductor chip 100 warps in a concave shape before being peeled off as shown in FIG. 56A because a speed at which the PSA tape 101 is peeled off is slower than a speed at which the thrust pins 102 are lifted, and is finally cracked as shown in FIG. 56B. Further, as shown in FIG. 57A, if the rear surface side of the semiconductor chip 100 is raised with the thrust pins 102 via the PSA tape 101, cracks are caused in portions of the semiconductor chip 100 that contact the thrust pins 102 with only the corner portions being peeled off, or the thrust pins 102 penetrate as shown in FIG. 57B, leading to a crack of the chip. If the thickness of the semiconductor chip is 100 µm or more, such phenomenon is less likely to occur since strength (thickness direction) of the semiconductor chip is higher than a force of adhesion to the semiconductor chip 100 of the PSA tape 101.

If the thickness of the semiconductor chip is thus reduced, deflecting strength of the semiconductor chip is decreased. Moreover, quality deterioration such as the cracks and chipping, and a lowering yield ratio can not be avoided with a conventional mechanism and method of peeling the PSA tape and a conventional device and method for picking up the semiconductor chip. Therefore, improvement has been desired not only in such a mechanism, device and methods, but also in an apparatus and method of manufacturing the semiconductor device comprising the above.

Especially, when an adhesive, an adhesive sheet or an adhesive film adheres to the rear surface or element formation surface of the semiconductor chip, load is higher during peeling off and fracture is more frequently caused, resulting in a problem of the quality deterioration and lowering yield ratio in the semiconductor device.

BRIEF SUMMARY OF THE INVENTION

According to a first aspect of the present invention, there is provided a semiconductor manufacturing apparatus comprising:

a peeling mechanism to peel a pressure sensitive adhesive (PSA) tape from a semiconductor wafer constituted by a plurality of semiconductor chips which are separated therefrom, the semiconductor wafer having an element formation surface to form an element thereon and a rear surface opposite to the element formation surface, the PSA tape adhering to the element formation surface of the semiconductor wafer, each of the semiconductor chips having an adhesive layer formed on the rear surface;

wherein the peeling mechanism has a sucking section which have a porous member to hold the semiconductor wafer by suction, the porous member being segmented into at least two sucking areas in the direction in which the PSA tape is peeled.

According to a second aspect of the present invention, there is provided a semiconductor manufacturing apparatus comprising:

a peeling mechanism to peel a PSA tape from a semiconductor wafer which has an element formation surface to form an element thereon, a rear surface opposite to the element formation surface and an adhesive layer formed on the entire rear surface and which are broken to be separated into semiconductor chips, the PSA tape adhering to the element formation surface of the semiconductor wafer;

wherein the peeling mechanism has a sucking section which have a porous member to hold the semiconductor wafer by suction and has a cutting device to cut the adhesive layer, the porous member being segmented into at least two sucking areas in the direction in which the PSA tape is peeled.

According to a third aspect of the present invention, there is provided a semiconductor manufacturing apparatus comprising:

a peeling mechanism to peel a PSA tape from a semiconductor wafer which has an element formation surface to form an element thereon, a rear surface opposite to the element formation surface and an adhesive layer formed on the entire rear surface, the PSA tape adhering to the element formation surface of the semiconductor wafer;

wherein the peeling mechanism has a sucking section with a porous member to hold the semiconductor wafer by suction and has a cutting device to cut the semiconductor wafer into semiconductor chips together with the adhesive layer, the porous member being segmented into at least two sucking areas in the direction in which the PSA tape is peeled.

According to a fourth aspect of the present invention, there is provided a semiconductor manufacturing apparatus comprising:

a peeling mechanism to peel a PSA tape from a semiconductor wafer constituted by a plurality of semiconductor chips which are separated therefrom, each semiconductor chip having an element formation surface to form an element thereon and an adhesive layer formed on the element formation surface, the PSA tape adhering to the element formation surface of the semiconductor wafer via the adhesive layers;

wherein the peeling mechanism has a sucking section which have a porous member to hold the semiconductor wafer by suction, the porous member being segmented into at least two sucking areas in the direction in which the PSA tape is peeled.

According to a fifth aspect of the present invention, there is provided a semiconductor manufacturing apparatus comprising:

a peeling mechanism to peel a PSA tape from a semiconductor wafer which has an element formation surface to form an element thereon and an adhesive layer formed on the element formation surface, the PSA tape adhering to the element formation surface of the semiconductor wafer via the adhesive layer;

wherein the peeling mechanism has a sucking section with a porous member to hold the semiconductor wafer by suction and has a cutting device to cut the semiconductor wafer into semiconductor chips together with the adhesive layer, the porous member being segmented into at least two sucking areas in the direction in which the PSA tape is peeled.

According to a sixth aspect of the present invention, there is provided a semiconductor manufacturing apparatus comprising:

a peeling mechanism to peel a PSA tape from a semiconductor wafer which has an element formation surface to form an element thereon and an adhesive layer formed on the entire element formation surface and which are broken to be separated into semiconductor chips, the PSA tape adhering to the element formation surface of the semiconductor wafer via the adhesive layer;

wherein the peeling mechanism has a sucking section which have a porous member to hold the semiconductor wafer by suction and has a cutting device to cut the adhesive layer, the porous member being segmented into at least two sucking areas in the direction in which the PSA tape is peeled.

According to a seventh aspect of the present invention, there is provided a semiconductor manufacturing apparatus comprising:

a peeling mechanism to peel a PSA tape from a semiconductor wafer which has an element formation surface to form an element thereon, the PSA tape adhering to the element formation surface of the semiconductor wafer;

wherein the peeling mechanism has a sucking section with a porous member to hold the semiconductor wafer by suction and has a cutting device to cut the semiconductor wafer into semiconductor chips, the porous member being segmented into at least two sucking areas in the direction in which the PSA tape is peeled.

According to an eighth aspect of the present invention, there is provided a method of manufacturing a semiconductor device comprising:

peeling a PSA tape from a semiconductor wafer constituted by a plurality of semiconductor chips which are separated therefrom, the semiconductor wafer having an element formation surface to form an element thereon and a rear surface opposite to the element formation surface, the PSA tape adhering to the element formation surface of the semiconductor wafer, each of the semiconductor chips having an adhesive layer formed on the rear surface thereof;

wherein the peeling of the PSA tape includes holding the semiconductor wafer via a porous member segmented into at least two sucking areas in the direction in which the PSA tape is peeled, by suction through at least two suction paths in association with the sucking areas of the porous member, the suction paths being alternatively switched when part of the PSA tape corresponding to adjacent sucking areas of the porous member is peeled off near the adjacent sucking area for next peeling in the direction in which the PSA tape is peeled.

According to a ninth aspect of the present invention, there is provided a method of manufacturing a semiconductor device comprising:

peeling a PSA tape from a semiconductor wafer which are separated into semiconductor chips, the semiconductor wafer having an element formation surface to form an element thereon, a rear surface opposite to the element formation surface and an adhesive layer formed on the entire rear surface, the PSA tape adhering to the element formation surface of the semiconductor wafer; and cutting the adhesive layer so that the adhesive layer is separated for each semiconductor chip after the PSA tape is peeled;

wherein the peeling of the PSA tape includes holding the semiconductor wafer via a porous member segmented into at least two sucking areas in the direction in which the PSA tape is peeled, by suction through at least two suction paths in association with the sucking areas of the porous member, respectively, the suction paths being alternatively switched when part of the PSA tape corresponding to adjacent sucking areas of the porous member is peeled off near the adjacent sucking area for next peeling in the direction in which the PSA tape is peeled; and the cutting of the adhesive layer is implemented in parallel to switching between the at least two suction paths in response to the state in which the adhesive layer is cut.

According to a tenth aspect of the present invention, there is provided a method of manufacturing a semiconductor device comprising:

peeling a PSA tape from a semiconductor wafer, the semiconductor wafer having an element formation surface to form an element thereon, a rear surface opposite to the element formation surface and an adhesive layer formed on the entire rear surface, the PSA tape adhering to the element formation surface of the semiconductor wafer; and cutting the semiconductor wafer into semiconductor chips together with the adhesive layer after the PSA tape is peeled;

wherein the peeling of the PSA tape includes holding the semiconductor wafer via a porous member segmented into at least two sucking areas in the direction in which the PSA tape is peeled, by suction through at least two suction paths in association with the sucking areas of the porous member, respectively, the suction paths being alternatively switched therebetween when part of the PSA tape corresponding to adjacent sucking areas of the porous member is peeled off near the adjacent sucking area for next peeling in the direction in which the PSA tape is peeled; and the cutting of the semiconductor wafer and the adhesive layer is implemented in parallel to switching between the at least two suction paths in response to the state in which the semiconductor wafer and the adhesive layer are cut.

According to an eleventh aspect of the present invention, there is provided a method of manufacturing a semiconductor device comprising:

peeling a PSA tape from a semiconductor wafer, the semiconductor wafer having an element formation surface to form an element thereon and an adhesive layer formed on the element formation surface, the semiconductor wafer having been broken to be separated into semiconductor chips; and cutting the adhesive layer so that the adhesive layer is separated for each semiconductor chip after peeling the PSA tape;

wherein the peeling of the PSA tape includes holding the semiconductor wafer via a porous member segmented into at least two sucking areas in the direction in which the PSA tape is peeled, by suction through at least two suction paths in association with the sucking areas of the porous member, respectively, the suction paths being alternatively switched when part of the PSA tape corresponding to adjacent sucking areas of the porous member is peeled off near the adjacent sucking area for next peeling in the direction in which the PSA tape is peeled, and the cutting of the adhesive layer is implemented in parallel to switching between the at least two suction paths in response to the state in which the adhesive layer is cut.

According to a twelfth aspect of the present invention, there is provided a method of manufacturing a semiconductor device comprising:

peeling a PSA tape from a semiconductor wafer constituted by a plurality of semiconductor chips which are separated therefrom, each semiconductor chip having an element formation surface to form an element thereon and an adhesive layer on the element formation surface, the PSA tape adhering to the semiconductor wafer via the adhesive layers;

wherein the peeling of the PSA tape includes holding the semiconductor wafer via a porous member segmented into at least two sucking areas in the direction in which the PSA tape is peeled, by suction through at least two suction paths in association with the sucking areas of the porous member, and the suction paths are alternatively switched therebetween when part of the PSA tape corresponding to adjacent sucking areas of the porous member is peeled off near the adjacent sucking area for next peeling in the direction in which the PSA tape is peeled.

According to a thirteenth aspect of the present invention, there is provided a method of manufacturing a semiconductor device comprising:

peeling a PSA tape from a semiconductor wafer, the semiconductor wafer having an element formation surface to form an element thereon and an adhesive layer formed on the element formation surface, the PSA tape adhering to the element formation surface of the semiconductor wafer via the adhesive layers; and cutting the semiconductor wafer into semiconductor chips together with the adhesive layer after the PSA tape is peeled;

wherein the peeling of the PSA tape includes holding the semiconductor wafer via a porous member segmented into at least two sucking areas in the direction in which the PSA tape is peeled, by suction through at least two suction paths in association with the sucking areas of the porous member, respectively, the suction paths being alternatively switched when part of the PSA tape corresponding to adjacent sucking areas of the porous member is peeled off near the adjacent sucking area for next peeling in the direction in which the PSA tape is peeled; and the cutting of the semiconductor wafer and the adhesive layer is implemented in parallel to switching between the at least two suction paths in response to the state in which the adhesive layer and the adhesive layer are cut.

According to a fourteenth aspect of the present invention, there is provided a method of manufacturing a semiconductor device comprising:

peeling a PSA tape from a semiconductor wafer, the PSA tape adhering to the semiconductor wafer; and cutting the semiconductor wafer into semiconductor chips after the PSA tape is peeled;

wherein the peeling of the PSA tape includes holding the semiconductor wafer via a porous member segmented into at least two sucking areas in the direction in which the PSA tape is peeled, by suction through at least two suction paths in association with the sucking areas of the porous member, the suction paths being alternatively switched therebetween when part of the PSA tape corresponding to adjacent sucking areas of the porous member is peeled off near the adjacent sucking area for next peeling in the direction in which the PSA tape is peeled; and the cutting of the semiconductor wafer is implemented in parallel to switching between the at least two suction paths in response to the state in which the semiconductor wafer is cut.

BRIEF DESCRIPTION OF THE DRAWINGS

In the accompanying drawings:

FIG. 1A is a perspective view of a semiconductor wafer used in a first embodiment of the present invention;

FIG. 1B is a sectional view of a portion along the line A—A of FIG. 1A;

FIG. 3A is a plane view of a wafer sucking section used in a peeling mechanism and a pickup mechanism of the semiconductor manufacturing apparatus shown in FIG. 2;

FIG. 3B is a sectional view of a portion along the line 3H—3H of FIG. 3A;

FIGS. 6A and 6B are diagrams explaining configuration examples of auxiliary plates;

FIG. 16A is a perspective view of a semiconductor wafer used in a third embodiment of the invention;

FIG. 16B is a sectional view of a portion along the line C—C of FIG. 16A;

FIGS. 17A and 17B are process sectional views explaining a peeling process and a pickup process according to a third embodiment of the invention;

FIG. 18A is a perspective view of a semiconductor wafer used in a fourth embodiment of the invention;

FIG. 18B is a sectional view of a portion along the line D—D of FIG. 18A;

FIGS. 19A to 19C are process sectional views explaining a peeling process through a pickup process according to a fourth embodiment of the invention;

FIG. 24A is a perspective view of the semiconductor wafer used in a seventh embodiment of the invention;

FIG. 24B is a sectional view of a portion along the line G—G of FIG. 24A;

FIGS. 25A to 25C are process sectional views explaining a peeling process through a pickup process according to a seventh embodiment of the invention;

FIG. 29A is a plane view showing still another configuration example different from a configuration example of a wafer sucking section shown in FIG. 3;

FIG. 29B is a sectional view of a portion along the line 29H—29H of FIG. 30A;

FIG. 30A is a plane view showing still another configuration example different from a configuration example of a wafer sucking section shown in FIG. 3;

FIG. 30B is a sectional view of a portion along the line 30H—30H of FIG. 30A;

FIG. 31A is a plane view showing still another configuration example different from a configuration example of a wafer sucking section shown in FIG. 3;

FIG. 31B is a sectional view of a portion along the line 31H—31H of FIG. 31A;

FIG. 32A is a plane view showing still another configuration example different from a configuration example of a wafer sucking section shown in FIG. 3;

FIG. 32B is a sectional view of a portion along the line 32H—32H of FIG. 32A;

FIG. 33A is a plane view showing still another configuration example different from a configuration example of a wafer sucking section shown in FIG. 3;

FIG. 33B is a sectional view of a portion along the line 33H—33H of FIG. 33A;

FIG. 34A is a plane view showing still another configuration example different from a configuration example of a wafer sucking section shown in FIG. 3;

FIG. 34B is a sectional view of a portion along the line 34H—34H of FIG. 34A;

FIG. 35A is a plane view showing still another configuration example different from a configuration example of a wafer sucking section shown in FIG. 3;

FIG. 35B is a sectional view of a portion along the line 35H—35H of FIG. 35A;

FIG. 36A is a plane view showing still another configuration example different from a configuration example of a wafer sucking section shown in FIG. 3;

FIG. 36B is a sectional view of a portion along the line 36H—36H of FIG. 36A;

FIG. 37A is a plane view showing still another configuration example different from a configuration example of a wafer sucking section shown in FIG. 3;

FIG. 37B is a sectional view of a portion along the line 37H—37H of FIG. 37A;

FIG. 38A is a plane view showing still another configuration example different from a configuration example of a wafer sucking section shown in FIG. 3;

FIG. 38B is a sectional view of a portion along the line 38H—38H of FIG. 38A;

FIG. 46A is a plane view showing still another configuration example different from a configuration example of a wafer sucking section shown in FIG. 3;

FIG. 46B is a sectional view of a portion along the line 46H—46H of FIG. 46A;

FIG. 47A is a plane view showing still another configuration example different from a configuration example of a wafer sucking section shown in FIG. 3;

FIG. 47B is a sectional view of a portion along the line 47H—47H of FIG. 47A;

FIG. 48A is a plane view showing still another configuration example different from a configuration example of a wafer sucking section shown in FIG. 3;

FIG. 48B is a sectional view of a portion along the line 48H—48H of FIG. 48A;

FIG. 55 is an enlarged sectional view of essential components of a conventional pickup device in picking up a semiconductor chip from a PSA tape;

FIGS. 56A and 56B are a sectional view and a plan view of a semiconductor chip, respectively, to explain a crack which may occur when the thickness of the semiconductor chip is 100 μm or more; and FIGS. 57A and 57B are a sectional view and a plan view of another semiconductor chip, respectively, to explain another crack which may occur when the thickness of the semiconductor chip is 100 μm or more.

DETAILED DESCRIPTION OF THE INVENTION

Embodiments of the invention will hereinafter be described in reference to the drawings.

First, a first embodiment will be described referring to FIG. 1A to FIG. 13C.

In this embodiment, a die bonder having a peeling mechanism for a PSA tape and a pickup mechanism for semiconductor chips will be explained by way of example as a semiconductor manufacturing apparatus.

Figure 2:
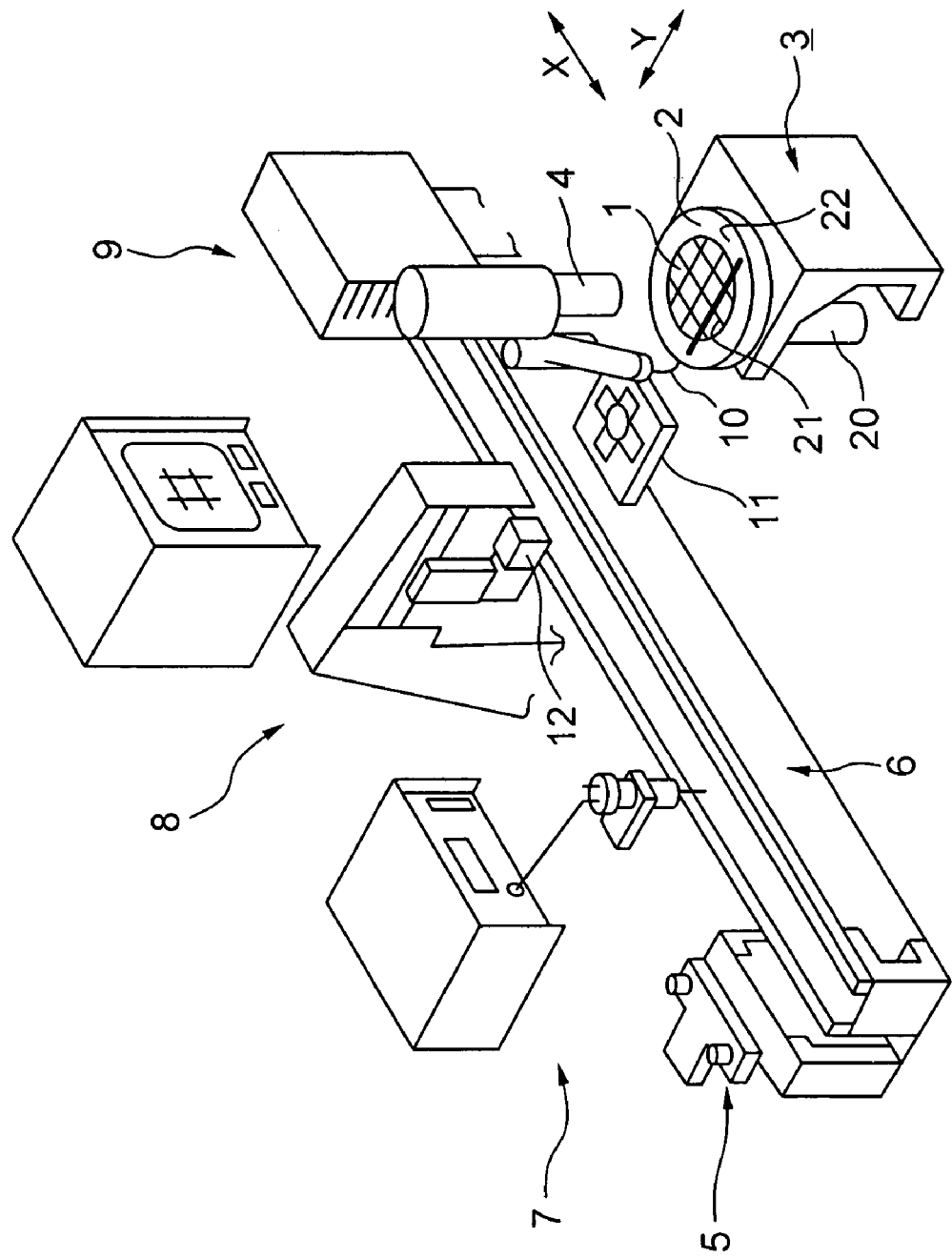
FIG. 2 is a perspective view showing a schematic configuration of a semiconductor manufacturing apparatus according to a first embodiment of the present invention.
Figure 4A:
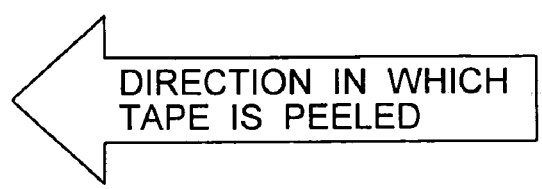
FIGS. 4A to 4C are plane views explaining a positional relationship between a wafer sucking section of the semiconductor manufacturing apparatus shown in FIG. 2 and the semiconductor wafer broken into pieces.
Figure 4A:
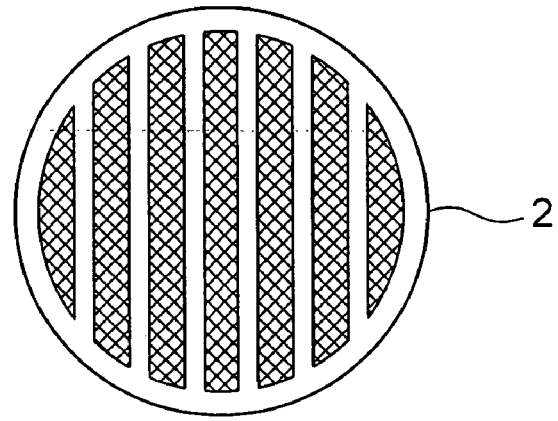
Figure 4B:
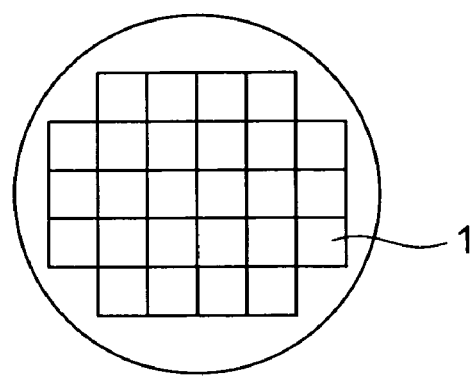
Figure 4C:
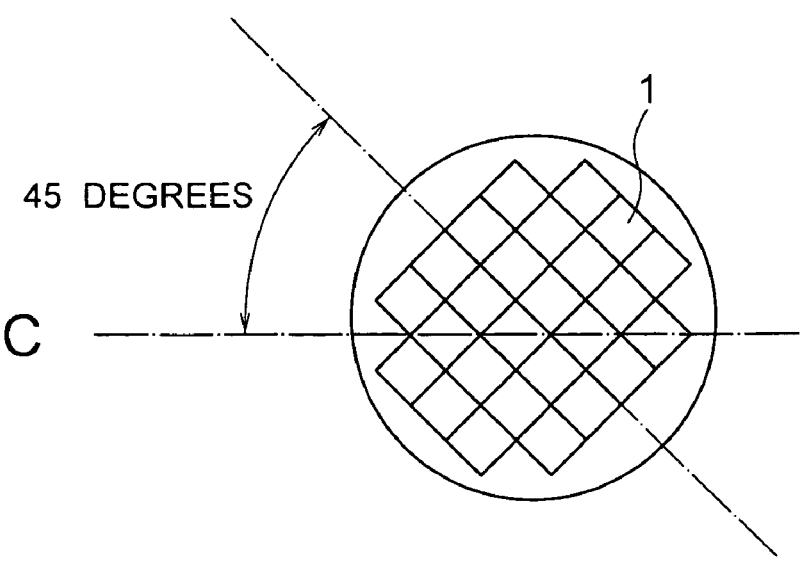
Figure 5:
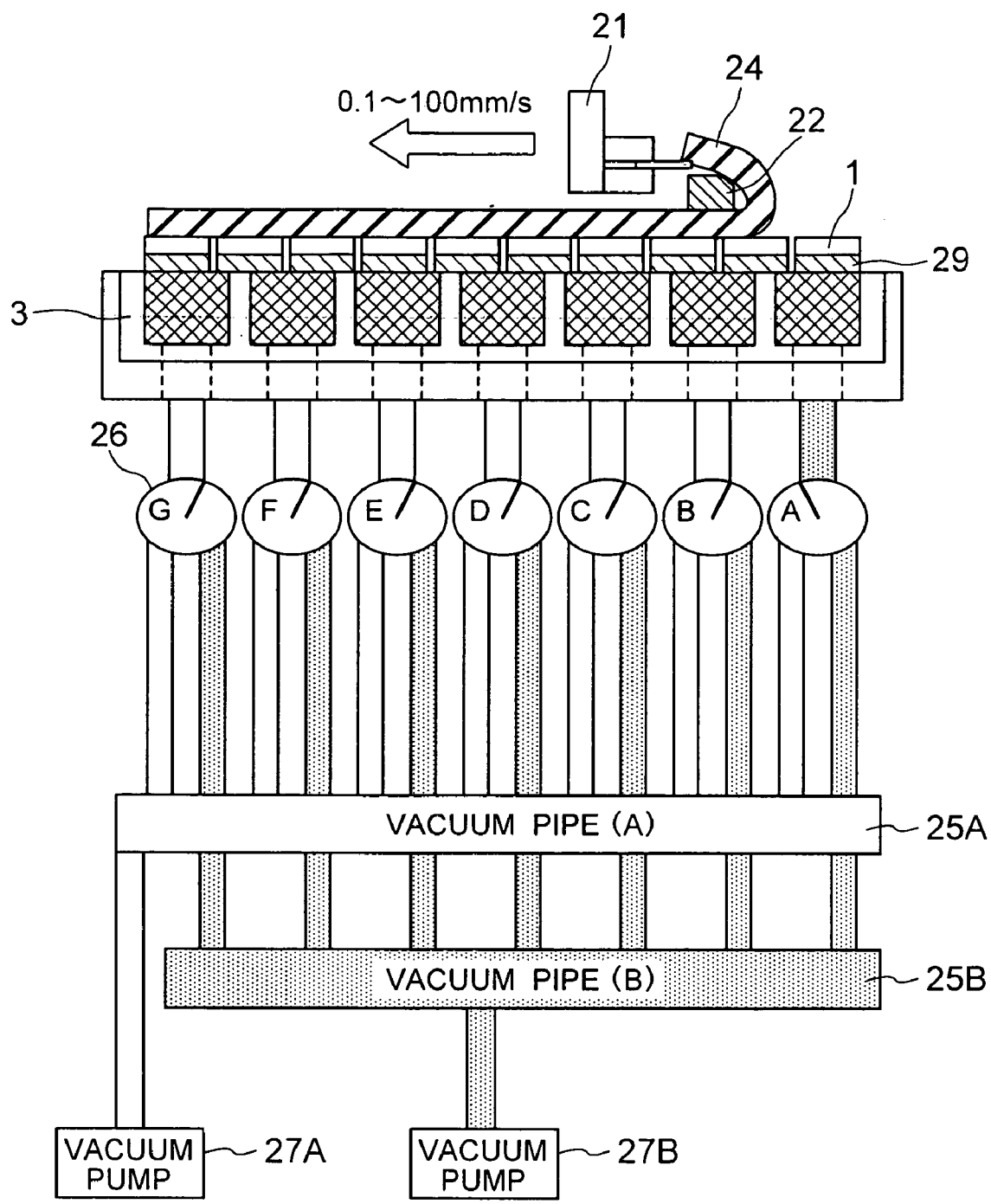
FIG. 5 is a sectional view explaining an operation of a peeling mechanism of the semiconductor manufacturing apparatus shown in FIG. 2.
Figure 7:
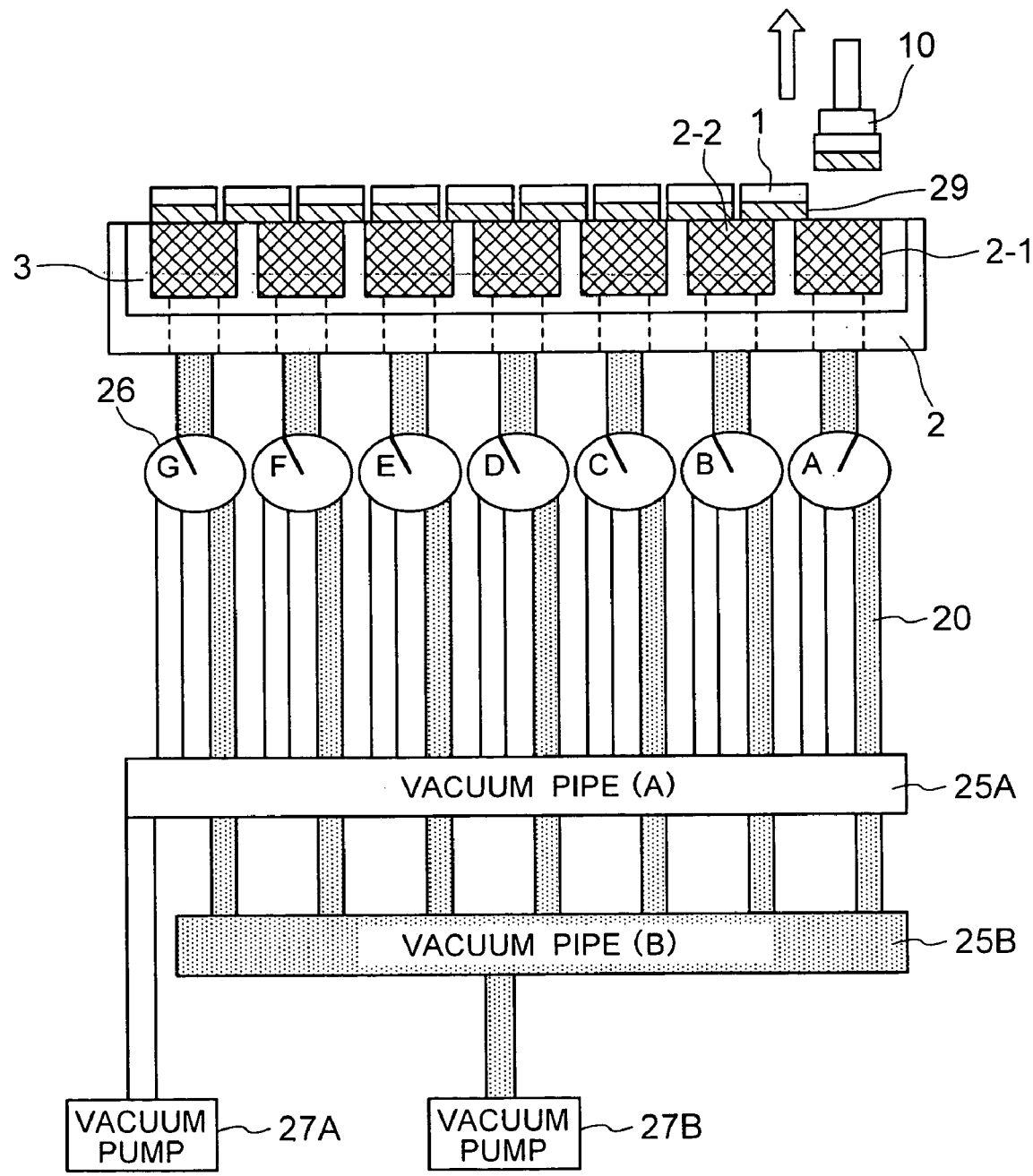
FIGS. 7 and 8 are sectional views explaining an operation of the pickup mechanism of the semiconductor manufacturing apparatus shown in FIG. 2.
Figure 8:
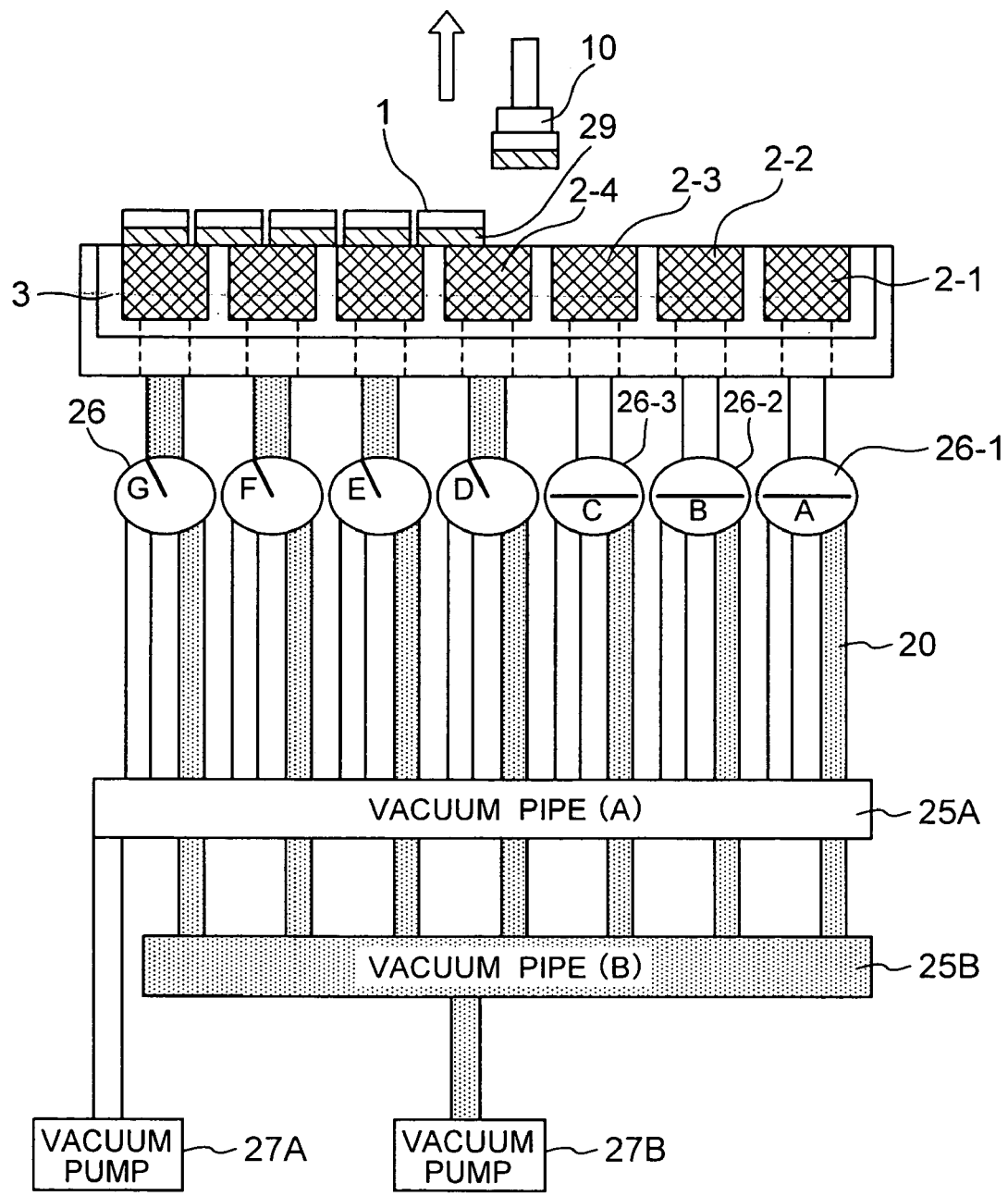
Figure 9A:
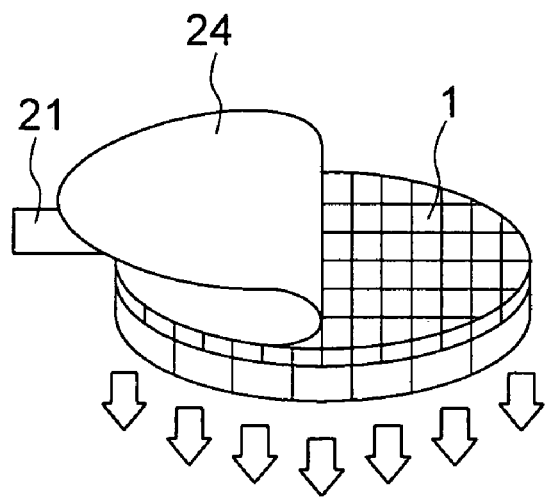
FIGS. 9A to 9C are schematic diagrams explaining one example of a process of mounting the semiconductor chips which are picked up.
Figure 9B:
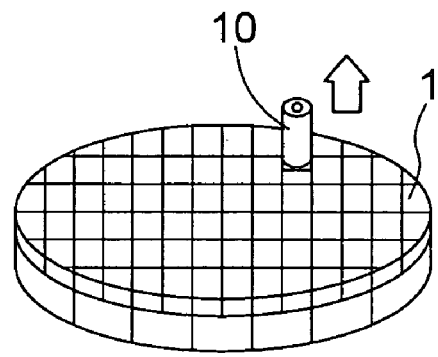
Figure 9C:
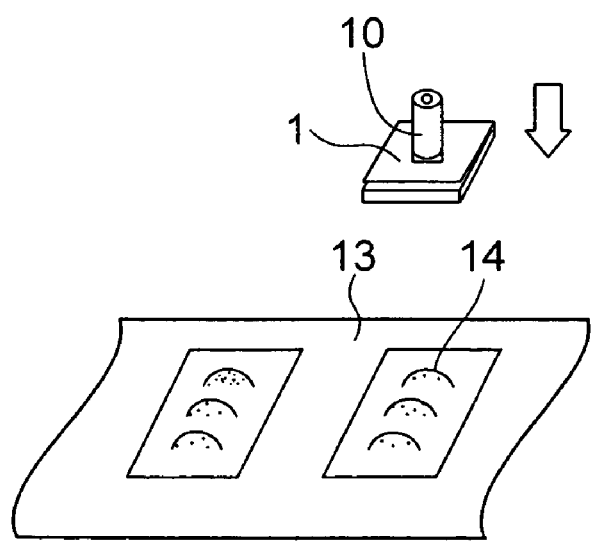

FIG. 1A is a perspective view of a semiconductor wafer used in this embodiment, FIG. 1B is a sectional view of a portion along the line A—A of FIG. 1A; FIG. 2 is a perspective view showing a schematic configuration of a semiconductor manufacturing apparatus according to this embodiment; FIG. 3A is a plane view of a wafer sucking section used in the peeling mechanism and the pickup mechanism of the semiconductor manufacturing apparatus shown in FIG. 2, FIG. 3B is a sectional view of a portion along the line 3H—3H of FIG. 3A; FIGS. 4A to 4C are plane views explaining a positional relationship between the wafer sucking section of the semiconductor manufacturing apparatus shown in FIG. 2 and the semiconductor wafer separated into semiconductor chips; FIG. 5 is a sectional view explaining an operation of the peeling mechanism of the die bonder of FIG. 2; FIGS. 6A and 6B are diagrams explaining configuration examples of auxiliary plates; FIGS. 7 and 8 are sectional views explaining an operation of the pickup mechanism of the die bonder shown in FIG. 2; FIGS. 9A to 9C are schematic diagrams explaining one example of a process of mounting the semiconductor chips which are picked up; FIGS. 10A to 13C are sectional views showing other examples of the process of mounting the semiconductor chips which are picked up.

In the semiconductor wafer shown in FIGS. 1, a PSA tape 24 covers an entire element formation surface having an element formation area as a surface protection tape, and an adhesive layer 29 is formed on a rear surface. In the present embodiment, the adhesive layer 29 is separately formed for each semiconductor chip.

The die bonder shown in FIG. 2 comprises the mechanism to peel off the PSA tape, a pickup mechanism to pick up the semiconductor chips, a transfer mechanism to transfer the semiconductor chips picked up onto a leadframe, and a conveying mechanism to convey the leadframe. The peeling mechanism includes a holding table 3, a video camera 4, a peeling claw 21, an auxiliary plate 22 and a suction unit 20. The pickup mechanism has the holding table 3, the video camera 4, a suction collet 10 and the suction unit 20. The peeling mechanism and the pickup mechanism share the holding table 3, the video camera 4 and the suction unit 20.

The holding table 3 has a porous member separated into at least two sucking areas (into blocks) in a direction to peel off the PSA tape, for example, a wafer sucking section 2 comprised of a film-like ceramic material/glass epoxy substrate. In this embodiment, as shown in FIGS. 3, the wafer sucking section 2 has seven sucking areas 2-1 to 2-7. Under the sucking areas 2-1 to 2-7, connection holes 23-1 to 23-7 are provided for connecting vacuum pipes. On this wafer sucking section 2, the semiconductor chips 1, which have been formed from the semiconductor wafer with elements having been finished, and which is affixed to the PSA tape 24 (refer to FIG. 5), are sucked to be fixed on a surface opposite to the element formation surface via the adhesive layer 29. At this moment, as shown in FIGS. 4A and 4B, if a longitudinal direction of the sucking areas 2-1 to 2-7 is disposed to be at right angles to a peeling direction, positions of the semiconductor chips 1 are easily identified during pickup. On the other hand, if diagonal lines of the semiconductor chips 1 are disposed in a direction parallel to the peeling direction (with an inclination of 45 degrees when the semiconductor chips are square) as shown in FIGS. 4A and 4C, the PSA tape 24 starts to be peeled off at corner portions of the semiconductor chips 1, making it easy to peel off. The size and thickness of the semiconductor chips 1, adhesion force of the PSA tape 24 and the like may be considered to decide which arrangement to select.

The holding table 3 moves the individual semiconductor chips 1 onto the suction unit 20 by moving the semiconductor wafer in an XY direction. The video camera 4 monitors the surface of the semiconductor chips 1. The suction unit 20 is disposed under the holding table 3, and has, for example, two vacuum (suction) pumps corresponding to at least two systems of vacuum (suction) pipes that are provided in a manner corresponding to the sucking areas 2-1 to 2-7 of the wafer sucking section 2; a changeover valve to change the vacuum pipes; and a controller to control the changeover valve.

The transfer mechanism to transfer the semiconductor chips 1 onto the leadframe is comprised of a bonding tool 8, the suction collet 10, a position correction stage 11, a bonding head 12 and the like. The suction collet 10 is also used in pickup, and sucks the semiconductor chips 1 peeled off from the PSA tape 24 and transfers them onto the position correction stage 11. The position of the semiconductor chip 1 is corrected on the position correction stage 11. The semiconductor chips 1 whose position is corrected are transferred onto the leadframe by the bonding head 8.

Furthermore, the conveying mechanism to convey the leadframe is comprised of a leadframe supplying section 5, a leadframe conveying unit 6, a paste conveying unit 7, a leadframe housing section 9 and the like. The leadframe supplying section 5 stores the leadframe before die bonding, and sequentially sends out the leadframe to the leadframe conveying unit 6. The paste conveying unit 7 applies a conductive paste to a bed portion of the leadframe conveyed by the leadframe conveying unit 6. Further, the leadframe housing section 9 stores the leadframe with the die bonding having finished.

A schematic operation of the whole die bonder is as follows. First, the semiconductor wafer with the element formation having finished is broken into pieces to form a plurality of semiconductor chips 1, and the semiconductor chips 1 are transferred and adhesively bonded to the PSA tapes 24, and mounted on the holding table 3. Alternatively, cut grooves are formed along dicing lines (or chip division lines) on the element formation surface side in the semiconductor wafer with the element formation having finished by a method called a dicing before grinding, and the PSA tape 24 is affixed onto the element formation surface side, and then the semiconductor wafer is separated into semiconductor chips by grinding the rear surface of the wafer to reach at least the cut grooves mentioned above, thus mounting the plurality of semiconductor chips 1 on the holding table 3. Next, the semiconductor chip 1 is directly sucked and fixed by the suction unit 20, and the PSA tape is peeled off by use of the peeling claw 21 and the auxiliary plate 22. Subsequently, the holding table 3 is moved in the XY direction, and the surface of the semiconductor chip 1 is monitored using the video camera 4, and image data obtained with this monitor is binarized or multi-valued to conduct detection such as positional detection and mark detection for identification of non-defective/defective products for the semiconductor chips 1. Moreover, the semiconductor chip 1 is held by the suction collet 10 while being sucked by the vacuum of the suction unit 20 (not always needs to be sucked by the vacuum depending on the size and thickness of the semiconductor chip) so that they are picked up and transferred onto the position correction stage 11. After the position and, if needed, arrangement of front and back of the semiconductor chip 1 are adjusted, it is transferred onto the leadframe by the bonding head 8.

Next, after the pickup is finished, the holding table 3 is moved to a position of the semiconductor chip 1 to be picked up next. This operation is further repeated.

On the other hand, the leadframe supplying section 5 sequentially sends out the leadframe to the leadframe conveying unit 6. From the paste conveying unit 7, the conductive paste is applied to the bed portion of the leadframe conveyed by the leadframe conveying unit 6. Further, the semiconductor chip 1 transferred by the bonding head 8 is mounted on the bed portion of the leadframe (this is called the die bonding). The leadframe housing section 9 stores the leadframe with the die bonding having finished. The above operation is sequentially repeated.

Next, the mechanism to peel off the PSA tape and the pickup mechanism for the semiconductor chips, and a peeling method and pickup method using those mechanisms in the die bonder mentioned above will be described in greater detail with reference to FIG. 5 to FIG. 9.

(1) First, the PSA tape 24 is affixed to the element formation surface, and the semiconductor wafer separated into semiconductor chips is prepared. The semiconductor wafer is comprised of the semiconductor chips 1 whose rear surfaces are covered with the adhesive layer 29. Further, as described above, the PSA tape is used for the surface protection tape or a support tape of the semiconductor wafer.

(2) The semiconductor wafer separated into semiconductor chips is set on the holding table 3.

(3) The holding table 3 is provided with two systems of vacuum pipes 25A and 25B, changeover valves 26A to 26G of the pipes and two vacuum pumps 27A and 27B, and these are used to peel off the PSA tape 24. The vacuum pipe 25A of a first system and the first vacuum pump 27A are first used to hold the semiconductor wafer adhesively bonded to the PSA tape 24 by vacuum.

(4) In this state, the PSA tape 24 starts to be peeled off. In peeling, a tape for peeling is adhesively bonded to edge sides of the PSA tape 24, and an edge of the tape for peeling is held by the peeling claw 21, and the auxiliary plate 22 to aid in peeling is set on the PSA tape 24, and then one edge of the PSA tape 24 is pulled at a speed of 0.1 mm to 100 mm/sec, preferably at a speed of 0.1 mm to 10 mm/sec in an arrow direction shown in the drawing by the peeling claw 21 while an upper surface of the PSA tape 24 is being held by the auxiliary plate 22 and the edge of the PSA tape 24 is being bended.

(5) At this time, the peeling claw 21 may be pulled with a variable force, and the peeling claw 21 and the auxiliary plate 22 may be moved at a fixed speed for peeling. Moreover, after pulling for a certain distance by the peeling claw 21, an operation for holding the upper surface of the PSA tape 24 with the auxiliary plate 22 may be repeated. Further, when part of the PSA tape 24 in the vicinity of the adjacent sucking areas 2-1 to 2-7 of the wafer sucking section 2 is peeled off, the vacuum pipe 25B of the second system is changed to by the changeover valves 26A to 26G, and the peeled semiconductor chips 1 in the sucking areas are sucked by the second vacuum pump 27B and fixed. FIG. 5 shows a state in which the peeling has proceeded to a boundary area between the sucking area 2-1 and the sucking area 2-2, and the changeover valve 26A has been changed.

(6) In the same manner, the changeover valves 26-B to 26-G will be sequentially changed as the PSA tape 24 is peeled off. Further, with the PSA tape 24 completely peeled off, each of the semiconductor chips 1 is transferred from the PSA tape 24 to the wafer sucking section 2, and each of the semiconductor chips 1 is fixed by vacuum by the second vacuum pump 27B via the vacuum pipe 25B of the second system. It should be understood that the auxiliary plate 22 may has a rounded tip as shown in FIG. 6A or a sharp tip as shown in FIG. 6B can be used. The shape of the tip portion is decided by the thickness, adhesion force, flexibility and the like (7) Next, the position and defectiveness of the semiconductor chips 1 are detected.

(8) Subsequently, each of the semiconductor chips 1 starts to be picked up from the wafer sucking section 2. Each of the semiconductor chips 1 is fixed by vacuum by the second vacuum pump 27B via the vacuum pipe 25B of the second system shortly after the start of pickup, and in this state, it is picked up only by suction force using the suction collet 10.

(9) Furthermore, when the pickup proceeds close to come to the boundary of the sucking area to be picked up next, the changeover valves are switched to the vacuum pipe 25A of the first system, and the sucking area in which the semiconductor chip has been picked up by use of the first vacuum pump 27A is sucked. FIG. 7 shows a state in which the pickup has been almost finished up to the sucking area 2-1, and the changeover valve 26A corresponding to the sucking area 2-1 is closed.

(10) In this way, the semiconductor chip 1 is picked up to expose part of the wafer sucking section 2, thereby making it possible to prevent the suction force of the second vacuum pump 27B from being decreased, and also possible to suck to fix defective chips remaining on the exposed wafer sucking section 2 and chips at a peripheral portion of the wafer that will not be products.

It should be understood that when the pickup has proceeded to the semiconductor chips in the sucking areas, the changeover valves may be closed to stop the suction, as shown in FIG. 8. FIG. 8 shows a state in which the pickup has progressed to the sucking area 2-4, and the changeover valves 26-A to 26-C corresponding to the sucking areas 2-1 to 2-3 are closed.

(11) Subsequently, the leadframe is die-bonded, as shown in FIGS. 9. FIGS. 9 schematically show a peeling process for the PSA tape 24 (a), a pickup process (b), and a process of mounting the semiconductor chip 1 to a leadframe 13 with a conductive paste 14 or the like.

(12) Furthermore, defective products and the semiconductor chips that will not be products in an outer peripheral portion of the wafer are destroyed.

According to the configuration and method described above, the semiconductor wafer separated into semiconductor chips can be effectively held by the optimal suction force in response to the position of the PSA tape which is being peeled and a pickup state of the semiconductor chips, so that cracks and chipping of the semiconductor chips during the peeling of the PSA tape or during the pickup can be prevented. Such cracks and chipping have been a problem in making the semiconductor chips thinner. Moreover, the pickup is performed only by suction, so that damage to the semiconductor chips can be prevented in the portion where thrust pins contact, which has been a problem associated with the pickup using conventional thrust pins. Further, as the adhesive layer is formed, stacked MCP products in which the semiconductor chips are stacked can easily be produced.

Cracks has often occurred (100 pcs/100 pcs) when the semiconductor chip is picked up if the thickness of the semiconductor chip is 50 μm or less in the prior art, but according to this embodiment, the occurrence of the cracks can be reduced to an almost negligible degree (0/100 pcs) even if the thickness of the semiconductor chip is 50 μm or less.

Figure 10A:
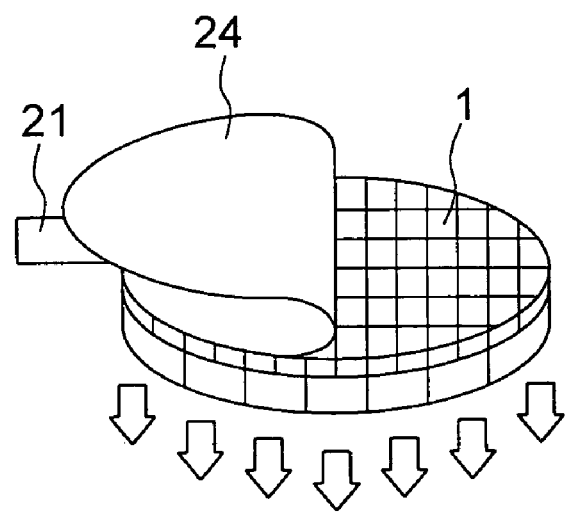
FIGS. 10A to 13C are sectional views showing other examples of the process of mounting the semiconductor chips which are picked up.
Figure 10B:
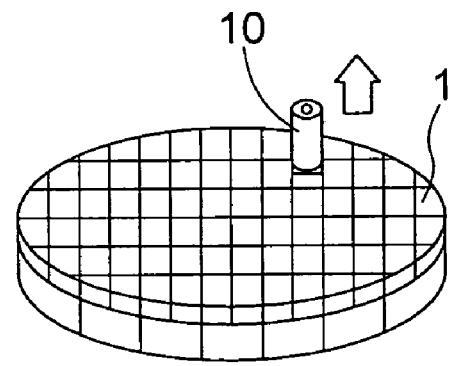
Figure 10C:
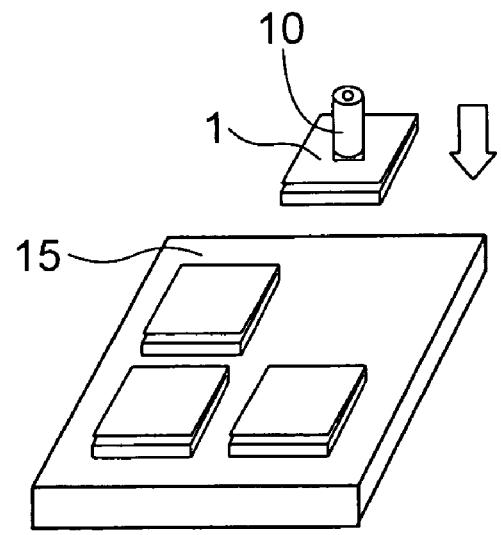
Figure 11A:
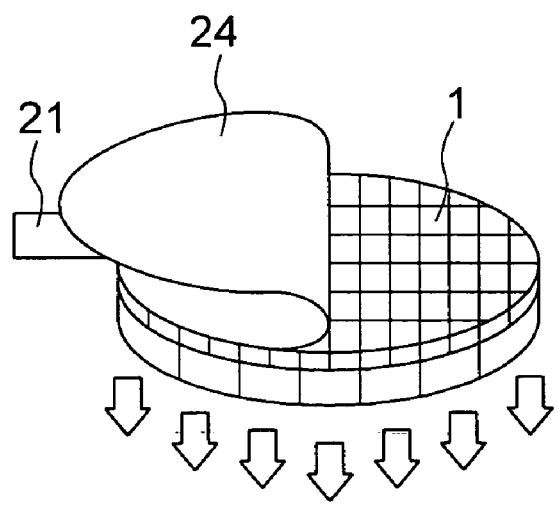
Figure 11B:
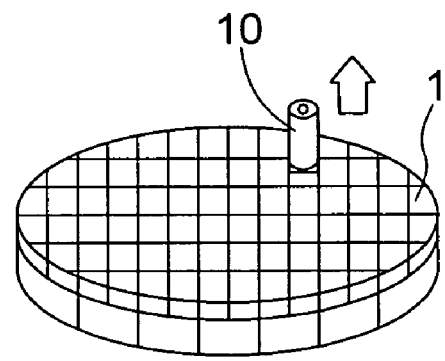
Figure 11C:
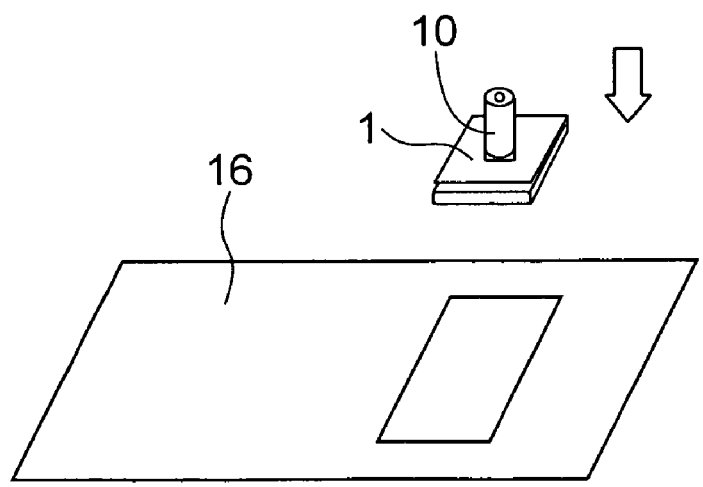
Figure 12A:
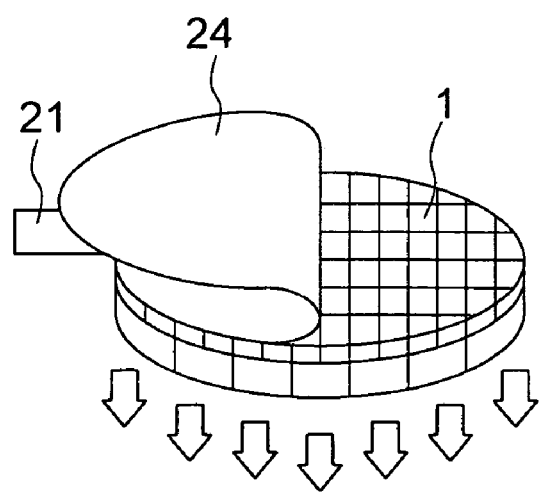
Figure 12B:
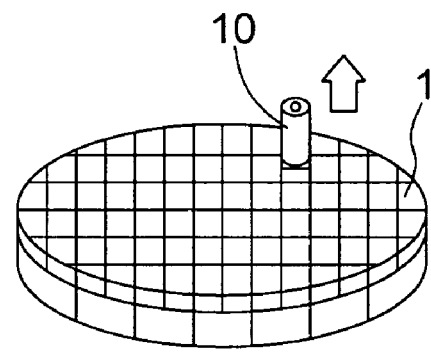
Figure 12C:
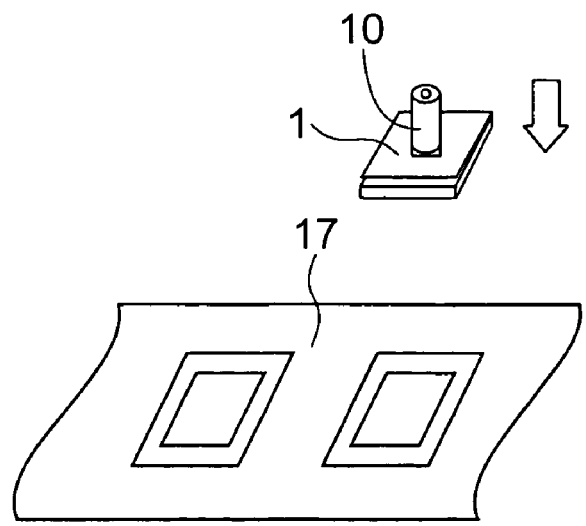
Figure 13A:
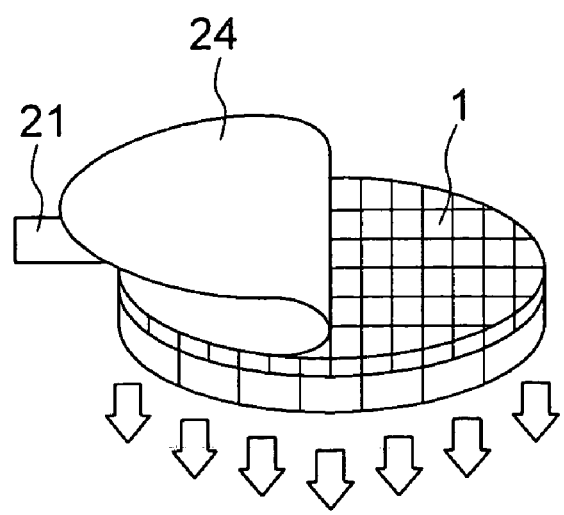
Figure 13B:
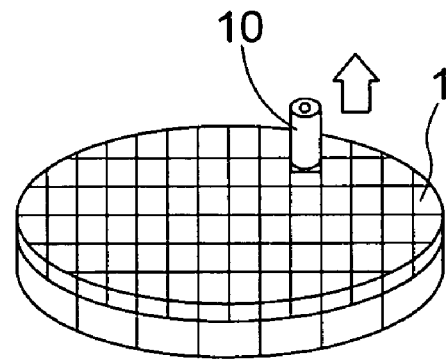
Figure 13C:
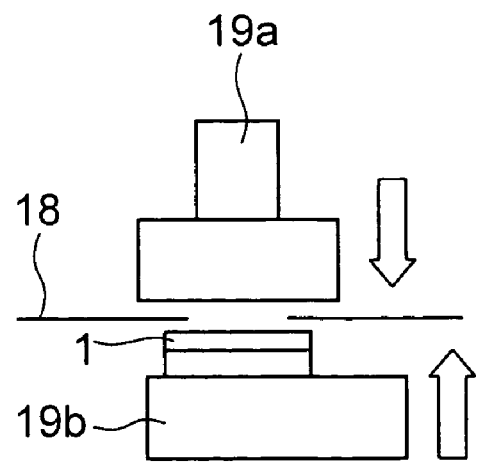

In addition, the die bonder has been described as an example in the above embodiment, but the present invention can also be applied to other semiconductor manufacturing apparatuses that require the mechanism for peeling off the PSA tape and the pickup mechanism for the semiconductor chips. The other semiconductor manufacturing apparatuses include, for example, a picker for, after peeling off the PSA tape 24, picking up each of the semiconductor chips 1 to put it on a tray 15, as shown in FIGS. 10; a flip chip bonder for, after peeling off the PSA tape 24, picking up each of the semiconductor chips 1 to mount it onto a printed circuit board 16 by flip chip connection, as shown in FIG. 11; a film adhesive bonder for, after peeling off the PSA tape 24, picking up each of the semiconductor chips 1 to mount it on a thermoplastic film substrate 17, as shown in FIGS. 12; an inner lead bonder for, after peeling off the PSA tape 24, picking up each of the semiconductor chips 1 to mount it onto a TAB tape 18 by use of heating tools 19a and 19b, as shown in FIGS. 13.

Next, a second embodiment will be described referring to FIGS. 14 to FIGS. 15.

Figure 14A:
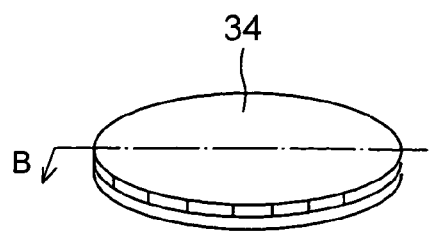
FIG. 14A is a perspective view of the semiconductor wafer used in a second embodiment of the invention.
Figure 14B:
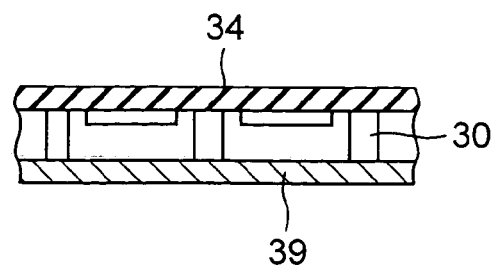
FIG. 14B is a sectional view of a portion along the line B—B of FIG. 14A.
Figure 15A:
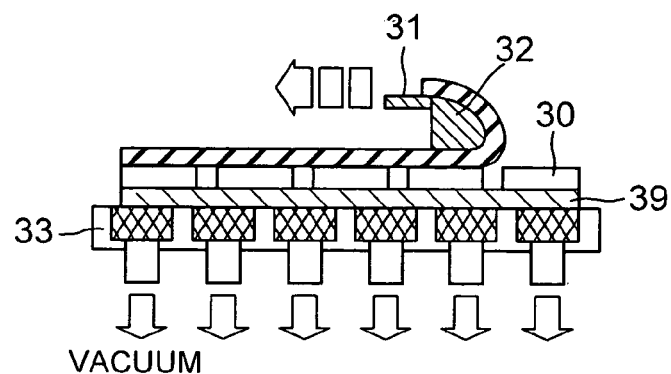
FIGS. 15A to 15C are process sectional views explaining a peeling process through a pickup process according to a second embodiment of the invention.
Figure 15B:
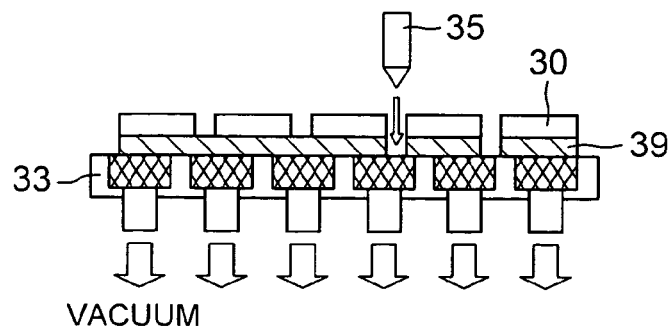
Figure 15C:
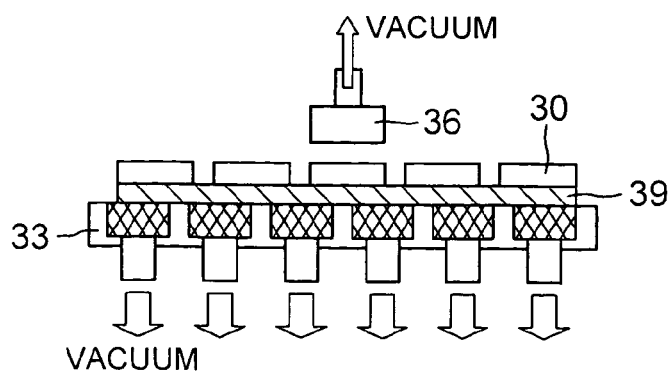

FIG. 14A is a perspective view of the semiconductor wafer used in this embodiment, FIG. 14B is a sectional view of a portion along the line B—B of FIG. 14A; and FIGS. 15A to 15C are process sectional views explaining processes from a peeling process for a PSA tape to a pickup process to pick up the semiconductor chips, which are implemented using the semiconductor manufacturing apparatus in this embodiment.

In the semiconductor wafer shown in FIGS. 14A and 14B, a PSA tape 34 covers the entire element formation surface having the element formation area as the surface protection tape, and an adhesive layer 39 such as an adhesive sheet or an adhesive film is formed on the rear surface. The adhesive layer 39 is formed on the entire surface of the semiconductor wafer.

First, the PSA tape 34 is peeled off by use of a peeling claw 31 and an auxiliary plate 32 while the semiconductor wafer is directly fixed from the surface thereof onto a holding table 33 by the suction unit. At this moment, the semiconductor wafer is fixed by vacuum onto the table which is made of a porous member divided into two or more segments connected to two or more systems of vacuum pipes, respectively, and the PSA tape 34 is peeled off while the pipe systems of porous blocks are alternatively switched in accordance with a peeling process of the PSA tape 34 (FIG. 15A). Subsequently, the adhesive layer 39 is cut into a chip size by use of a cutting tool 35 such as laser or a blade. In this case, the semiconductor wafer is fixed by vacuum onto the table which is made of the porous member which is divided into the two or more segments connected to two or more systems of vacuum pipes, respectively, and the pipe systems of porous blocks are alternatively switched in accordance with a cutting process to cut the adhesive layer 39 (FIG. 15B). Subsequently, each of semiconductor chips 30 starts to be picked up from the wafer sucking section. Shortly after the start of pickup, each of the semiconductor chips 30 is picked up only by suction force using a suction collet 36 (FIG. 15C). Each of the semiconductor chips 30 picked up is bonded to the leadframe or the like. The laser as the cutting tool includes a YAG laser, a $CO_2$ laser and a single pulse laser.

As described above, according to this embodiment, the semiconductor wafer separated into semiconductor chips can be effectively held with the optimal suction force in response to the position of the PSA tape which is being peeled and the pickup state of the semiconductor chips, so that the cracks and chipping of the semiconductor chips during the peeling of the PSA tape or during the pickup can be prevented which might have been the problem due to the reduced thickness of the semiconductor chips. Moreover, the pickup is performed only by suction, so that damage to the semiconductor chips can be prevented in the portion where the thrust pins contact, which has been the problem associated with the pickup using the conventional thrust pins. Further, as the adhesive layer is formed, the stacked MCP products in which the semiconductor chips are stacked can easily be produced.

Next, a third embodiment will be described referring to FIGS. 16A to FIGS. 17C.

This embodiment is characterized in that the adhesive layer is formed on the element formation surface of each of the semiconductor chips constituting the semiconductor wafer. FIG. 16A is a perspective view of a semiconductor wafer used in this embodiment, FIG. 16B is a sectional view of a portion along the line C—C of FIG. 16A; and FIGS. 17A and 17B are process sectional views explaining a peeling process for a PSA tape and a pickup process for picking up semiconductor chips, which are implemented using the semiconductor manufacturing apparatus in this embodiment.

In the semiconductor wafer shown in FIGS. 16A and 16B, a PSA tape 44 covers the entire element formation surface having the element formation area as a surface protection tape, and an adhesive layer 49 is formed on the rear surface. The adhesive layer 49 is put between the semiconductor wafer and the PSA tape 44, and separately formed for each semiconductor chip.

First, the PSA tape 44 is peeled off from the surface of the semiconductor wafer by use of a peeling claw 41 and an auxiliary plate 42 while the semiconductor wafer is directly sucked to be fixed by the suction unit onto a holding table 43. At this moment, the semiconductor wafer is fixed by vacuum on the table which is made of a porous member divided into two or more segments connected to two or more systems of vacuum pipes, respectively, and the pipe systems of porous blocks are alternatively switched in accordance with the peeling state of the PSA tape 44, thereby peeling off the PSA tape (FIG. 17A). Subsequently, each of semiconductor chips 40 starts to be picked up from the wafer sucking section. Shortly after the start of pickup, each of the semiconductor chips 40 is picked up only by suction force using a suction collet 46 (FIG. 17B). Each of the semiconductor chips 40 picked up is bonded to the leadframe or the like.

As described above, according to this embodiment, the semiconductor wafer separated into semiconductor chips can be effectively held by suction with the optimal suction force in response to the position of the PSA tape which is being peeled and the pickup state of the semiconductor chips, so that the cracks and chipping of the semiconductor chips during the peeling of the PSA tape or during the pickup can be prevented which might have been the problem due to the reduced thickness of the semiconductor chips. Moreover, the pickup is performed only by suction, so that damage to the semiconductor chips can be prevented in the portion where the thrust pins contact, which has been the problem associated with the pickup using the conventional thrust pins. Further, as the adhesive layer is formed on each of the semiconductor chips, the stacked MCP products in which the semiconductor chips are stacked can easily be produced.

Next, a fourth embodiment will be described referring to FIGS. 18A to FIGS. 19C.

This embodiment is characterized in that an adhesive layer is formed on the rear surface opposite to an element formation surface of a semiconductor wafer that has not yet been separated into semiconductor chips. FIG. 18A is a perspective view of a semiconductor wafer used in this embodiment; FIG. 18B is a sectional view of a portion along the line D—D of FIG. 18A; and FIGS. 19A to 19C are process sectional views explaining the peeling process for the PSA tape through the pickup process for picking up the semiconductor chips, which are implemented using the semiconductor manufacturing apparatus in this embodiment.

First, a PSA tape 54 is peeled off from the surface of the semiconductor wafer by use of a peeling claw 51 and an auxiliary plate 52 while the semiconductor wafer is directly held by suction by the suction unit on a holding table 53. At this moment, the semiconductor wafer is fixed by vacuum on the table which is made of a porous member divided into two or more segments connected to two or more systems of vacuum pipes, respectively, and the pipe systems of porous blocks are alternatively switched in accordance with the peeled state of the PSA tape 54, thereby peeling off the PSA tape (FIG. 19A). Subsequently, the semiconductor wafer and an adhesive layer 59 are cut into the chip size by use of a cutting tool 55 such as laser or a blade. In this case, the semiconductor wafer is fixed by vacuum on the table which is made of the porous member divided into two or more segments connected to two or more systems of vacuum pipes, respectively, and the pipe systems of the porous blocks are alternatively switched in accordance with the cutting state of the adhesive layer 59 (FIG. 19B). Subsequently, each of semiconductor chips 50 starts to be picked up from the wafer sucking section. Shortly after the start of pickup, each of the semiconductor chips 50 is picked up only by suction force using a suction collet 56 (FIG. 19C). Each of the semiconductor chips 50 picked up is bonded to the leadframe or the like.

As described above, according to this embodiment, the semiconductor wafer separated into semiconductor chips can be effectively held by suction with the optimal suction force in response to the position of the PSA tape which is being peeled and the pickup state of the semiconductor chips, so that the cracks and chipping of the semiconductor chips during the peeling of the PSA tape or during the pickup can be prevented which might have been the problem due to the reduced thickness of the semiconductor chips. Moreover, the pickup is performed only by suction, so that damage to the semiconductor chips can be prevented in the portion where the thrust pins contact, which has been the problem associated with the pickup using the conventional thrust pins. Further, as the adhesive layer is formed on the rear surface of the semiconductor wafer, the stacked MCP products in which the semiconductor chips are stacked can easily be produced.

Next, a fifth embodiment of the present invention will be described referring to FIGS. 20A to FIGS. 21C.

Figure 20A:
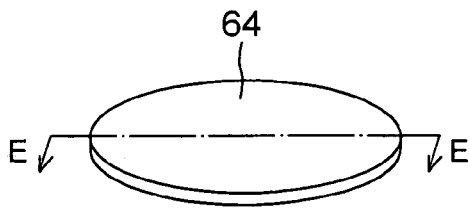
FIG. 20A is a perspective view of a semiconductor wafer used in a fifth embodiment of the invention.
Figure 20B:
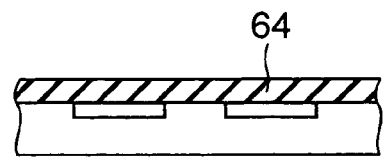
FIG. 20B is a sectional view of a portion along the line E—E of FIG. 20A.
Figure 21A:
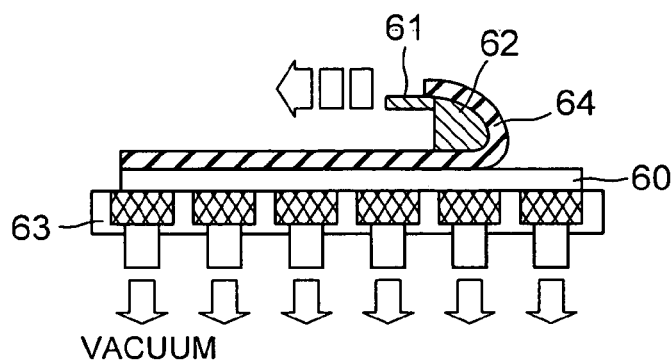
FIGS. 21A to 21C are process sectional views explaining a peeling process through a pickup process according to a fifth embodiment of the invention.
Figure 21B:
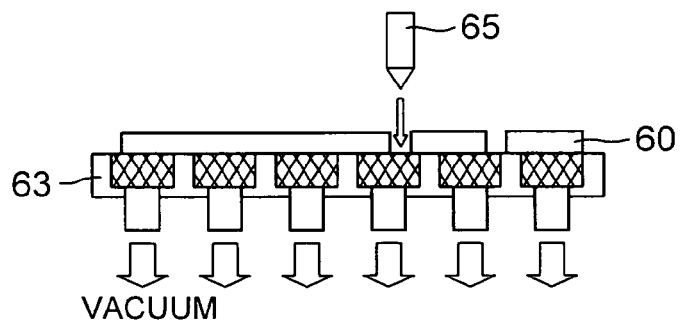
Figure 21C:
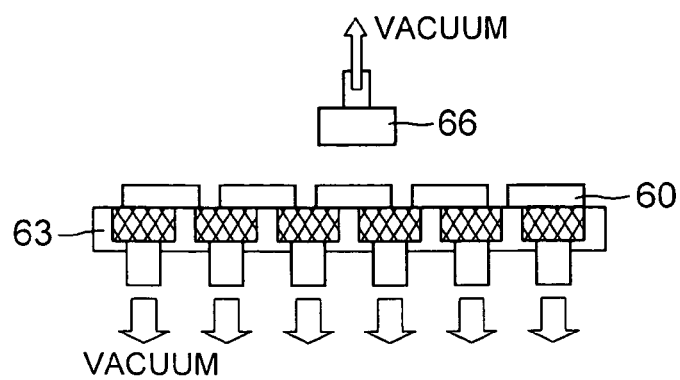

This embodiment is characterized in handling a semiconductor wafer which has not yet been separated into semiconductor chips and in which an adhesive layer is not formed on the semiconductor wafer. FIG. 20A is a perspective view of a semiconductor wafer used in this embodiment, FIG. 20B is a sectional view of a portion along the line E—E of FIG. 20A; and FIGS. 21A to 21C are process sectional views explaining a peeling process for a PSA tape through a pickup process for picking up semiconductor chips, which are implemented using a semiconductor manufacturing apparatus in this embodiment.

First, a PSA tape 64 is peeled off from the surface of the semiconductor wafer by use of a peeling claw 61 and an auxiliary plate 62 while the semiconductor wafer is directly held by suction by the suction unit on a holding table 63. At this moment, the semiconductor wafer is fixed by vacuum on the table which is made of a porous member divided into two or more segments connected to two or more systems of vacuum pipes, respectively, and the pipe systems of porous blocks are alternatively switched in accordance with the peeling state of the PSA tape 64, thereby peeling off the PSA tape (FIG. 21A). Subsequently, the semiconductor wafer is cut into the chip size by use of a cutting tool 65 such as laser or the blade. In this case, the semiconductor wafer is vacuum-fixed on the table which is made of the porous member divided into two or more segments connected to two or more systems of vacuum pipes, respectively, and the pipe systems of the porous blocks are alternatively switched in accordance with the cutting state to cut the semiconductor wafer (FIG. 21B). Subsequently, each of semiconductor chips 60 starts to be picked up from the wafer sucking section. Shortly after the start of pickup, each of the semiconductor chips 60 is picked up only by suction force using a suction collet 66 (FIG. 21C). Each of the semiconductor chips 60 picked up is bonded to the leadframe or the like.

As described above, according to this embodiment, the PSA tape is peeled off and the semiconductor wafer is separated into the semiconductor chips and picked up while the semiconductor wafer is being effectively held by suction with the optimal suction force so that the cracks and chipping of the semiconductor chips during the peeling of the PSA tape or during the pickup can be prevented, which might have been the problem due to the reduced thickness of the semiconductor chips. Moreover, the pickup is performed only by suction, so that damage to the semiconductor chips can be prevented in the portion where the thrust pins contact, which has been the problem associated with the pickup using the conventional thrust pins.

Next, a sixth embodiment will be described referring to FIGS. 22A to FIGS. 23C.

Figures 22A, 22B:
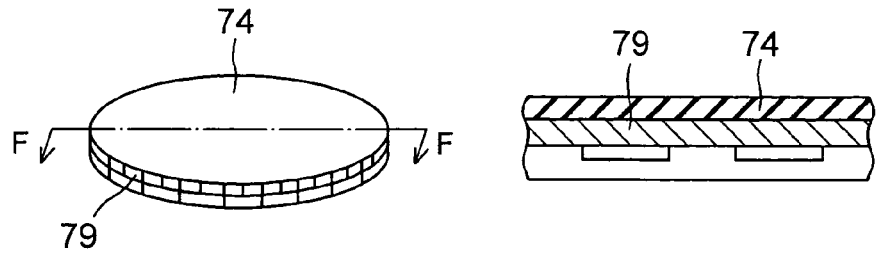
FIG. 22A is a perspective view of a semiconductor wafer used in a sixth embodiment of the invention.
FIG. 22B is a sectional view of a portion along the line F—F of FIG. 22A.
Figure 23A:
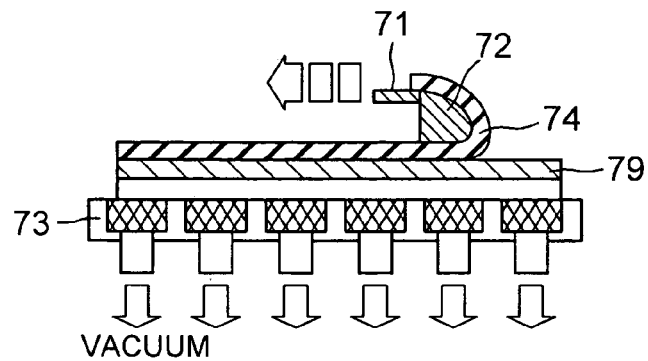
FIGS. 23A to 23C are process sectional views explaining a peeling process through a pickup process according to a sixth embodiment of the invention.
Figure 23B:
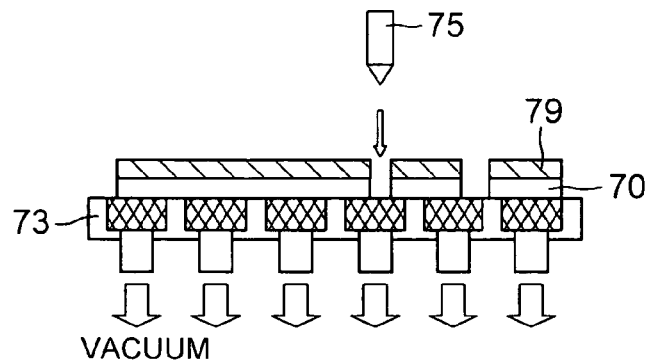
Figure 23C:
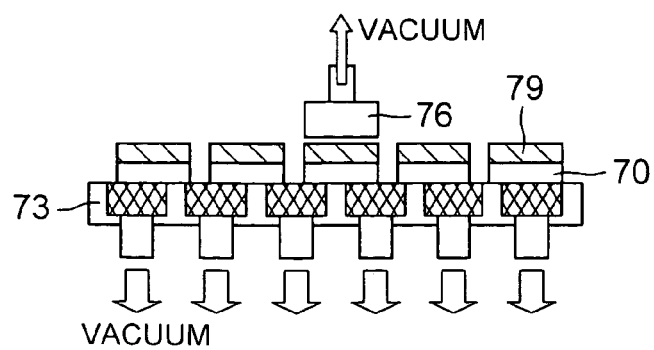

This embodiment is characterized in handling a semiconductor wafer which has not yet been separated into semiconductor chips and which has an adhesive layer formed on its element formation surface. FIG. 22A is a perspective view of a semiconductor wafer used in this embodiment, FIG. 22B is a sectional view of a portion along the line F—F of FIG. 22A; and FIGS. 23A to 23C are process sectional views explaining a peeling process for a PSA tape through a pickup process for picking up semiconductor chips, which are implemented using a semiconductor manufacturing apparatus in this embodiment.

First, a PSA tape 74 is peeled off from the surface of the semiconductor wafer by use of a peeling claw 71 and an auxiliary plate 72 while the semiconductor wafer is directly held by suction by the suction unit on a holding table 73. At this moment, the semiconductor wafer is fixed by vacuum on the table which is made of a porous member divided into two or more segments connected to two or more systems of vacuum pipes, respectively, and the pipe systems of porous blocks are alternatively switched in accordance with the peeling state of the PSA tape 74, thereby peeling off the PSA tape (FIG. 23A). Subsequently, the semiconductor wafer and an adhesive layer 79 are cut into the chip size by use of a cutting tool 75 such as laser or a blade. In this case, the semiconductor wafer is fixed by vacuum on the table which is made of the porous member divided into two or more segments connected to two or more systems of vacuum pipes, respectively, and the pipe systems of the porous blocks are alternatively switched in accordance with the cutting state of the adhesive layer 79 and the semiconductor wafer (FIG. 23B). Subsequently, each of semiconductor chips 70 starts to be picked up from the wafer sucking section. Shortly after the start of pickup, each of the semiconductor chips 70 is picked up only by suction force using a suction collet 76 (FIG. 23C). Each of the semiconductor chips 70 picked up is bonded to the leadframe or the like.

As described above, according to this embodiment, the semiconductor wafer can be effectively held by suction with the optimal suction force in response to the position of the PSA tape which is being peeled from the semiconductor wafer and each state of separation of the semiconductor wafer into semiconductor chips and picking up of the semiconductor chips. This makes it possible to prevent the cracks and chipping of the semiconductor chips during the peeling of the PSA tape or during the pickup, which might have been the problem due to the reduced thickness of the semiconductor chips. Moreover, the pickup is performed only by suction, so that damage to the semiconductor chips can be prevented in the portion where the thrust pins contact, which has been the problem associated with the pickup using the conventional thrust pins. Further, as the adhesive layer is formed on the semiconductor chips, the stacked MCP products in which the semiconductor chips are stacked can easily be produced.

Next, a seventh embodiment will be described referring to FIGS. 24A to FIGS. 25C.

FIG. 24A is a perspective view of the semiconductor wafer used in this embodiment, FIG. 24B is a sectional view of a portion along the line G—G of FIGS. 24A; and FIGS. 25A to 25C are process sectional views explaining a peeling process for a PSA tape through a process for picking up semiconductor chips, which are implemented using a semiconductor manufacturing apparatus in this embodiment.

In the semiconductor wafer shown in FIGS. 24A and 24B, a PSA tape 84 is formed over the entire element formation surface having the element formation area via an adhesive layer 89 such as an adhesive sheet or an adhesive film. The semiconductor wafer has already been broken to be separated into the semiconductor chips.

First, a PSA tape 84 is peeled off from the surface of the semiconductor wafer by use of a peeling claw 81 and an auxiliary plate 82 while the semiconductor wafer is directly held by suction by the suction unit on a holding table 83. At this moment, the semiconductor wafer is fixed by vacuum on the table which is made of a porous member divided into two or more segments connected to two or more systems of vacuum pipes, respectively, and the pipe systems of porous blocks are alternatively switched in accordance with the peeling state of the PSA tape 74, thereby peeling off the PSA tape (FIG. 25A). Subsequently, an adhesive layer 89 is cut into the chip size by use of a cutting tool 85 such as laser or a blade. In this case, the semiconductor wafer is fixed by vacuum on the table which is made of the porous member divided into two or more segments connected to two or more systems of vacuum pipes, respectively, and the pipe systems of the porous blocks are alternatively switched in accordance with the cutting state to cut the adhesive layer 89 (FIG. 25B). Subsequently, each of semiconductor chips 80 starts to be picked up from the wafer sucking section. Shortly after the start of pickup, each of the semiconductor chips 80 is picked up only by suction force using a suction collet 86 (FIG. 25C). Each of the semiconductor chips 80 picked up is bonded to the leadframe or the like.

As described above, according to this embodiment, the semiconductor wafer which has already been separated into semiconductor chips can be effectively held by suction with the optimal suction force in response to the position of the PSA tape which is being peeled and the pickup state of the semiconductor chips. This makes it possible to prevent the cracks and chipping of the semiconductor chips during the peeling of the PSA tape or during the pickup. Such cracks and chipping might have been the problem due to the reduced thickness of the semiconductor chips. Moreover, the pickup is performed only by suction, so that damage to the semiconductor chips can be prevented in the portion where the thrust pins contact, which has been the problem associated with the pickup using the conventional thrust pins. Further, as the adhesive layer is formed over the semiconductor wafer, the stacked MCP products in which the semiconductor chips are stacked can easily be produced.

Various configuration examples of the wafer sucking section will be described below referring to the drawings.

Figures 26A, 26B:
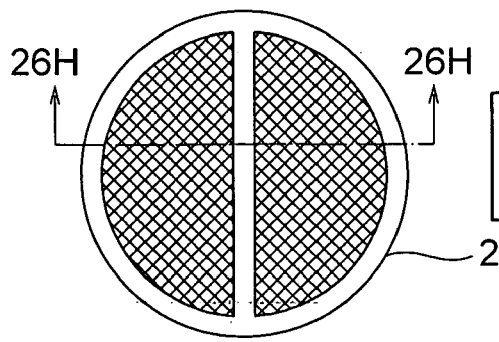
FIG. 26A is a plane view showing another configuration example different from a configuration example of a wafer sucking section shown in FIG. 3.
FIG. 26B is a sectional view of a portion along the line 26H—26H of FIG. 26A.
Figures 27A, 27B:
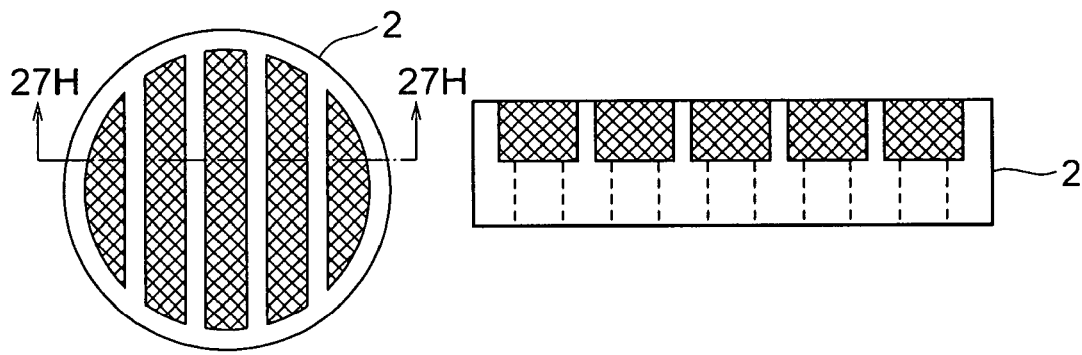
FIG. 27A is a plane view showing still another configuration example different from a configuration example of a wafer sucking section shown in FIG. 3.
FIG. 27B is a sectional view of a portion along the line 27H—27H of FIG. 27A.
Figures 28A, 28B:
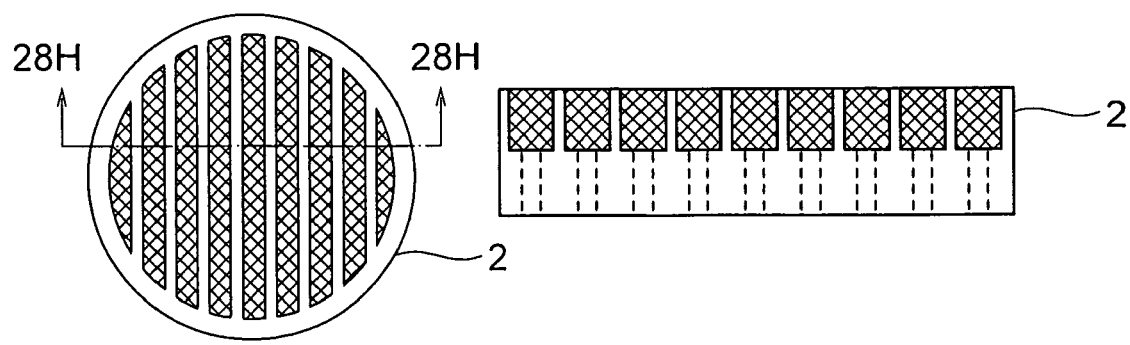
FIG. 28A is a plane view showing still another configuration example different from a configuration example of a wafer sucking section shown in FIG. 3.
FIG. 28B is a sectional view of a portion along the line 28H—28H of FIG. 28A.
Figure 39A:
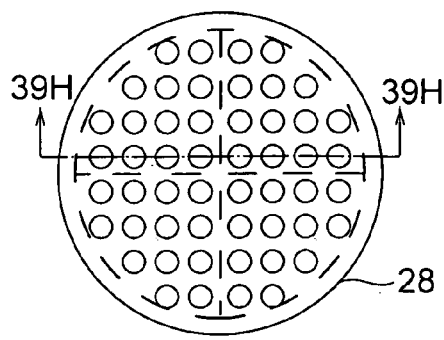
FIG. 39A is a plane view showing still another configuration example different from a configuration example of a wafer sucking section shown in FIG. 3.
Figure 39B:
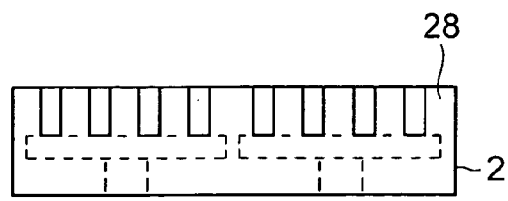
FIG. 39B is a sectional view of a portion along the line 39H—39H of FIG. 39A.
Figure 40A:
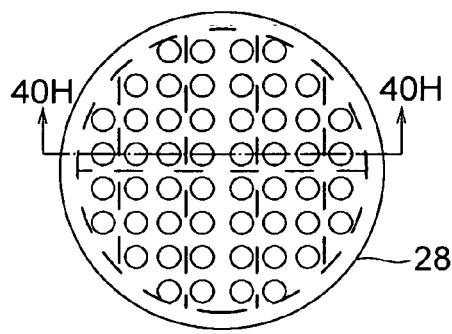
FIG. 40A is a plane view showing still another configuration example different from a configuration example of a wafer sucking section shown in FIG. 3.
Figure 40B:
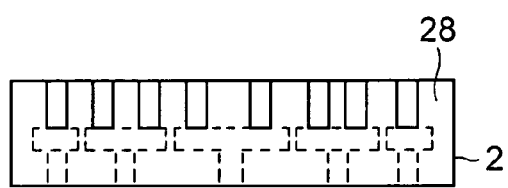
FIG. 40B is a sectional view of a portion along the line 40H—40H of FIG. 40A.
Figure 41A:
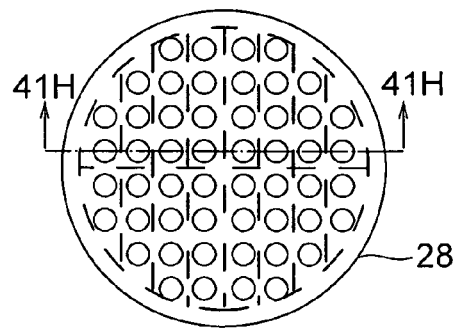
FIG. 41A is a plane view showing still another configuration example different from a configuration example of a wafer sucking section shown in FIG. 3.
Figure 41B:
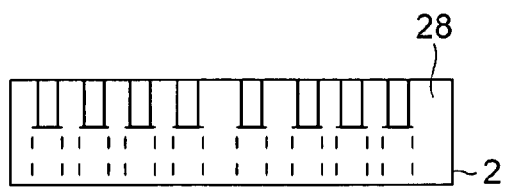
FIG. 41B is a sectional view of a portion along the line 41H—41H of FIG. 41A.
Figure 42A:
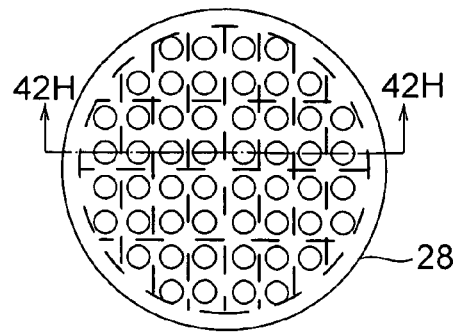
FIG. 42A is a plane view showing still another configuration example different from a configuration example of a wafer sucking section shown in FIG. 3.
Figure 42B:
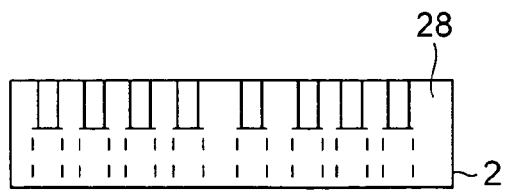
FIG. 42B is a sectional view of a portion along the line 42H—42H of FIG. 42A.
Figure 43A:
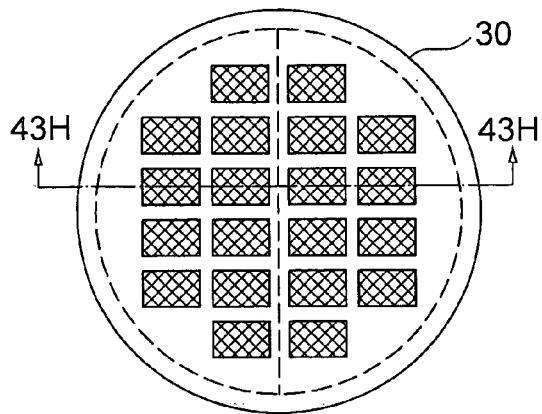
FIG. 43A is a plane view showing still another configuration example different from a configuration example of a wafer sucking section shown in FIG. 3.
Figure 43B:
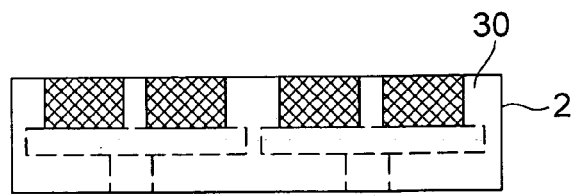
FIG. 43B is a sectional view of a portion along the line 43H—43H of FIG. 43A.
Figure 44A:
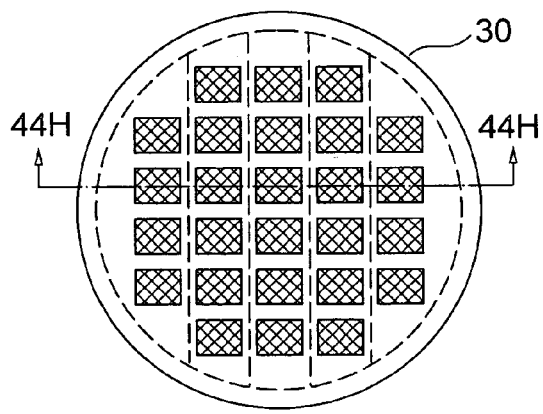
FIG. 44A is a plane view showing still another configuration example different from a configuration example of a wafer sucking section shown in FIG. 3.
Figure 44B:
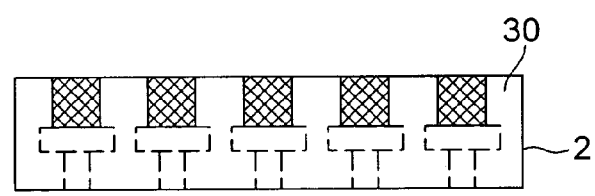
FIG. 44B is a sectional view of a portion along the line 44H—44H of FIG. 44A.
Figure 45A:
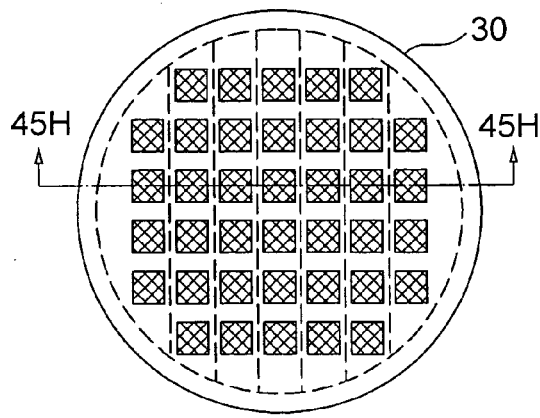
FIG. 45A is a plane view showing still another configuration example different from a configuration example of a wafer sucking section shown in FIG. 3.
Figure 45B:
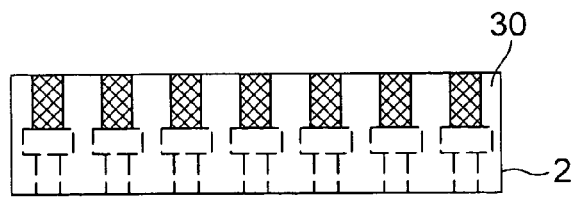
FIG. 45B is a sectional view of a portion along the line 45H—45H of FIG. 45A.

FIGS. 26A to FIGS. 28B show the various configuration examples of the wafer sucking section applied in the embodiments described above. The wafer sucking section 2 shown in FIGS. 26A and 26B is formed of the porous member which is separated into two sucking areas in the direction of peeling the PSA tape. The wafer sucking section 2 shown in FIGS. 27A and 27B is formed of the porous member which is separated into five sucking areas in the direction of peeling the PSA tape. The wafer sucking section 2 shown in FIGS. 28A and 28B is formed of the porous member which is separated into nine sucking areas in the direction of peeling the PSA tape.

In the wafer sucking sections 2 shown in FIGS. 29A and 29B to FIGS. 32A and 32B, the porous member is not only divided into a plurality of segments in the direction of peeling the PSA tape, but also divided into two in a direction perpendicular to the peeling direction, thereby providing four, ten, fourteen and eighteen sucking areas, respectively. Further, in the wafer sucking sections 2 shown in FIGS. 33A and 33B to FIGS. 35A and 35B, the porous member is not only divided into a plurality of pieces in the direction of peeling the PSA tape, but also divided into three, four and five in the direction perpendicular to the peeling direction, thereby providing 27, 32, and 41 sucking areas, respectively.

The wafer sucking sections 2 shown in FIGS. 36A and 36B to FIGS. 42A and 42B respectively comprise plates 28 having a plurality of through-holes provided on the porous member, and suck a semiconductor wafer 1 separated into semiconductor chips via these plates 28. The porous member is separated into two sucking areas in the direction of peeling the PSA tape in FIGS. 36A and 36B, and separated into five areas in FIGS. 37A and 37B, and separated into seven areas in FIGS. 38A and 38B. Further, the porous member is divided into two in the direction of peeling the PSA tape and two in the direction perpendicular to the peeling direction so as to be separated into four sucking areas in FIGS. 39A and 39B, separated into ten sucking areas in FIGS. 40A and 40B, separated into fourteen sucking areas in FIGS. 41A and 41B, and divided into four in the direction perpendicular to the peeling direction so as to be separated into 28 sucking areas in FIGS. 42A and 42B.

The wafer sucking sections 2 shown in FIGS. 43A and 43B to FIGS. 48A and 48B comprise plates 30 provided on the porous member to have the through-holes corresponding to the semiconductor chips, and suck the semiconductor chips via the plates 30. The porous member is separated into two sucking areas in the direction of peeling the PSA tape in FIGS. 43A and 43B, separated into five areas in FIGS. 44A and 44B, and separated into seven areas in FIGS. 45A and 45B. Further, the porous member is divided into two in the direction of peeling the PSA tape and two in the direction perpendicular to the peeling direction so as to be separated into four sucking areas in FIGS. 46A and 46B, separated into ten sucking areas in FIGS. 47A and 47B, and separated into fourteen sucking areas in FIGS. 48A and 48B.

These configurations are basically the same as that of the wafer sucking section shown in FIG. 2, and the most suitable configuration can be selected in view of the size and thickness of the semiconductor chip 1, the adhesion force, thickness, flexibility and the like of the PSA tape 24.

Next, a wafer ring applicable to the present invention will be described.

Figure 49A:
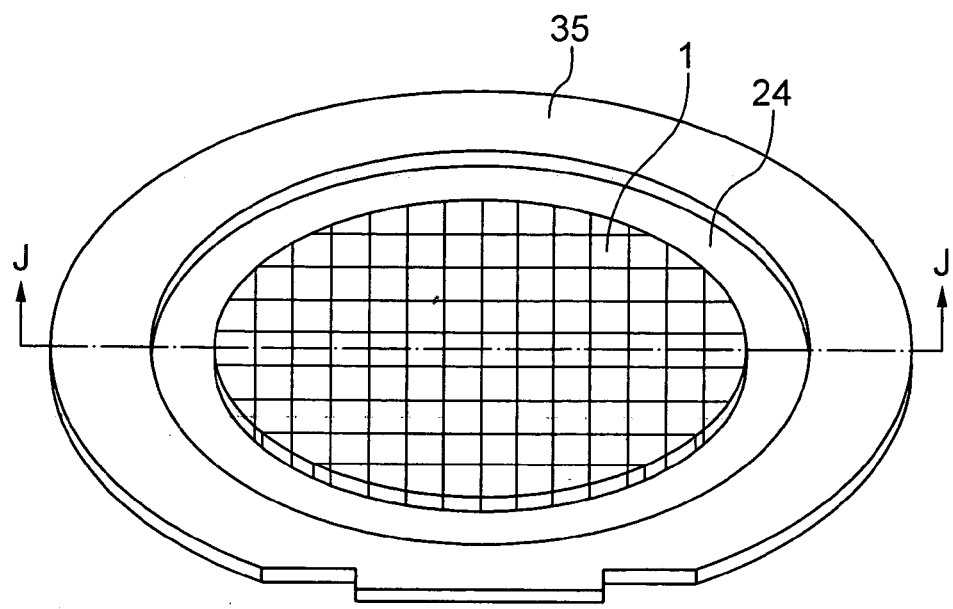
FIG. 49A is a perspective view of an example of a wafer ring equipped with a semiconductor wafer used in the present invention.
Figure 49B:
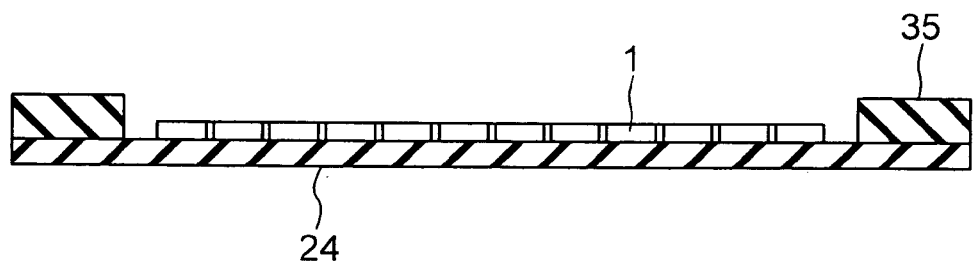
FIG. 49B is a sectional view of a portion along the line J—J of FIG. 49A.

FIG. 49A is a perspective view of an example of a wafer ring equipped with a semiconductor wafer, and FIG. 49B is a sectional view of a portion along the line J—J of FIG. 49A. The PSA tape 24 is affixed to a wafer ring 35, and the semiconductor wafer separated into semiconductor chips is affixed to the PSA tape 24. The wafer ring 35 and the PSA tape 24 are used in a rear surface grinding process of the semiconductor wafer. Here, the PSA tape 24 preferably protrudes from the outer peripheral portion of the semiconductor wafer separated into semiconductor chips, and has a size substantially equal to the diameter of the wafer ring. After the rear surface has been ground, the adhesive layer is affixed to the semiconductor chips 1.

When the PSA tape 24 is peeled off from the semiconductor wafer, the tape for peeling is adhesively bonded to an outer peripheral portion of the PSA tape 24 affixed to the wafer ring 35, and the tape for peeling is gripped by the peeling claw, and then the PSA tape 24 is peeled off by pulling it in a direction parallel to the sucked surface of the semiconductor chip 1. Alternatively, an end of the PSA tape 24 is directly gripped by the peeling claw 21, and the PSA tape 24 is peeled off by pulling it in the direction parallel to the sucked surface of the semiconductor chip 1. Subsequently, the PSA tape 24 is first peeled off from the wafer ring 35, and then the semiconductor wafer is peeled off, thus proceeding to the pickup process.

In this way, the force necessary to peel off the PSA tape 24 from the semiconductor chip 1 can be significantly reduced, so that it is relatively easy to peel it off even when the size of the semiconductor chip 1 is small, even when adhesion between a surface protection film on the element formation surface of the semiconductor chip 1 and the PSA tape 24 is very high, and even when the surface of the semiconductor chip 1 is extremely uneven. Therefore, the outer peripheral portion of the semiconductor chip 1 never remains bonded to the PSA tape 24 due to peeling failure.

Next, an eighth embodiment of the present invention will be described referring to FIGS. 50A to FIG. 54.

This embodiment is characterized in handling a semiconductor wafer which is comprised of separated semiconductor chips, and which has an adhesive layer formed on the entire surface opposite to its element formation surface, and a low dielectric constant insulation film (usually called a low-k film) formed on the element formation surface.

A fluorine-doped silicon oxide film having a relative dielectric constant (3.4 to 3.7) lower than that of a silicon oxide film (3.9 to 4.1) is widely used as a material of a low dielectric constant insulation film, for example, when it is used in a semiconductor device.

The low dielectric constant insulation film can be classified into two kinds of materials. The first kind is a material in which the relative dielectric constant is decreased by lowering the density of the silicon oxide film (relative dielectric constant 3.9 to 4.1), and includes, for example, MSQ (Methyl Silsesquioxane: $CH_3$—$SiO_{1.5}$ (relative dielectric constant 2.7 to 3.0), H (Hydrogen Silsesquioxane: H—$SiO_{1.5}$ (relative dielectric constant 3.5 to 3.8), porous HSQ (H—$SiO_x$ (relative dielectric constant 2.2), and porous MSQ ($CH_3$—$SiO_{1.5}$ (relative dielectric constant 2.0 to 2.5)), which are all based on a coating method. A material based on a plasma CVD method includes organic silica $CH_3$—$SiO_{1.5}$ (relative dielectric constant 2.5 to 3.0). In this embodiment, the low dielectric constant insulation film called the low-k film is a film whose a relative dielectric constant is below 3.9. The second kind is a material having a low polarizability in an organic film. For example, this includes PTFE (Polytetrafluoroethylene (relative dielectric constant 2.1)), PAE (Polyarylether: relative dielectric constant 2.7 to 2.9), porous PAE (relative dielectric constant 2.0 to 2.2), and BCB (Benzocyclobutene: relative dielectric constant 2.6 to 3.3). All of these can be formed into a film by a coating method such as spin coating.

Figure 50A:
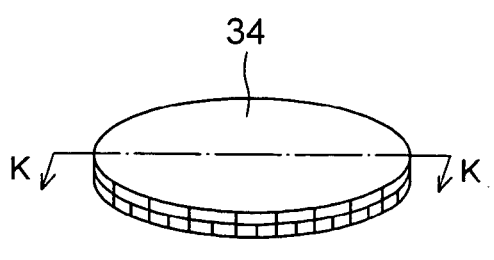
FIG. 50A is a perspective view of a semiconductor wafer used in a eighth embodiment of the invention.
Figure 50B:
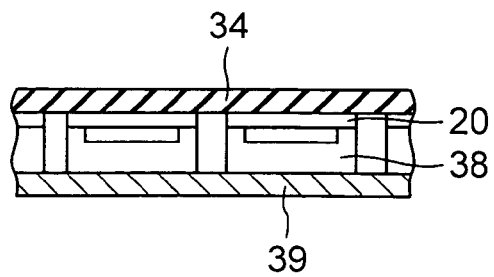
FIG. 50B is a sectional view of a portion along the line K—K of FIG. 50A.

FIG. 50A is a perspective view of a semiconductor wafer used in this embodiment, FIG. 50B is a sectional view of a portion along the line K—K of FIG. 50A; and FIGS. 51A to 51D are process sectional views explaining a peeling process for a PSA tape, a process of cutting and fusing an adhesive layer and a low dielectric constant insulation film, and a pickup process for picking up semiconductor chips, which are implemented using the semiconductor manufacturing apparatus in this embodiment.

The semiconductor wafer shown in FIGS. 50A and 50B has been beforehand broken to be separated into the semiconductor chips, and has an adhesive layer 39 formed on the surface opposite to the element formation surface. An element on each semiconductor chip is sealed with a resin, and a low dielectric constant insulation film 210 is formed in contact with the sealing resin, and a PSA tape 34 covers the entire element formation surface of the semiconductor wafer so as to contact the low dielectric constant insulation film 210.

Figure 51A:
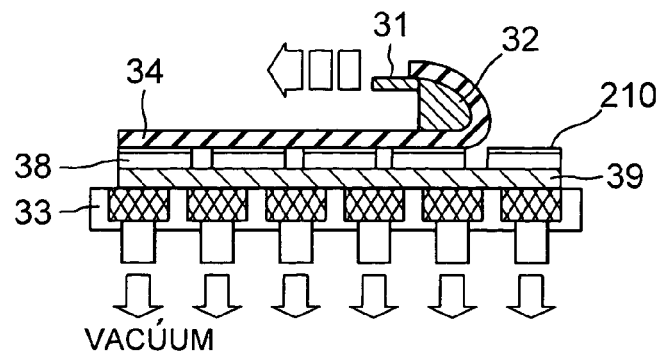
FIGS. 51A to 51D are process sectional views explaining a peeling process through a pickup process according to a eighth embodiment of the invention.
Figure 51B:
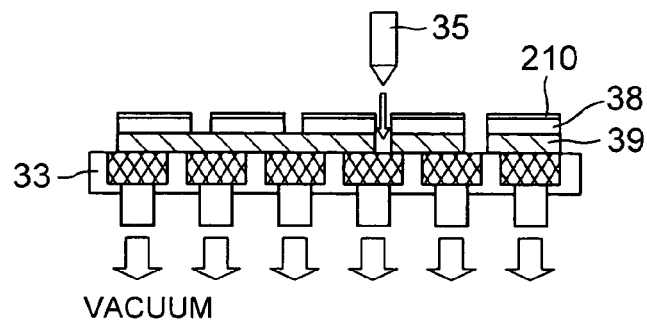
Figure 51C:
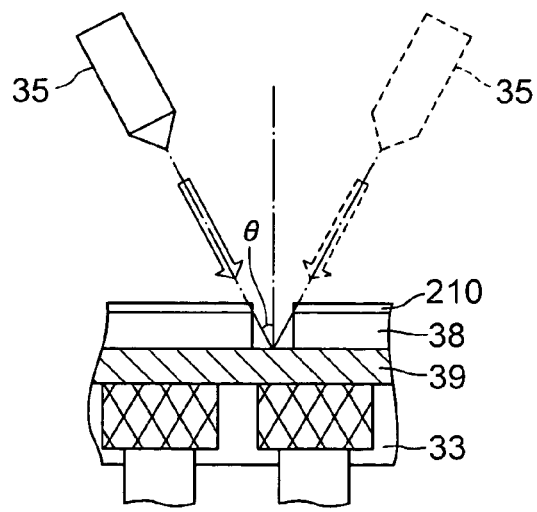

As shown in FIG. 51A, the PSA tape 34 is first peeled off from the surface of the semiconductor wafer by use of the peeling claw 31 and the auxiliary plate 32 while the semiconductor wafer is directly held by suction by the suction unit on the holding table 33. At this moment, the semiconductor wafer is fixed by vacuum on the table which is made of a porous member divided into two or more segments connected to two or more systems of vacuum pipes, respectively, and the pipe systems of porous blocks are alternatively switched in accordance with the peeling state of the PSA tape 34, thereby peeling off the PSA tape (FIG. 51A). Subsequently, the adhesive layer 39 is cut into the chip size by use of a cutting tool 75 such as laser or a blade. In this case, the semiconductor wafer is fixed by vacuum on the table which is made of the porous member divided into two or more segments connected to two or more systems of vacuum pipes, respectively, and the pipe systems of the porous blocks are alternatively switched in accordance with the cutting state of the adhesive layer 39 (FIG. 51B). In parallel with the cutting of the adhesive layer 39 or after the cutting of the adhesive layer 39, a peripheral edge of the low dielectric constant insulation film 210 is fused. In this embodiment, laser is applied to the peripheral edge of the low dielectric constant insulation film 210 with an incidence angle θ of 20° to 40° (FIG. 51C). In this way, the low dielectric constant insulation film 210, which has once been fused, is fixed on the sealing resin with higher adhesion when returning to the original temperature. As a result, the semiconductor chips in which the low dielectric constant insulation film is not easily peeled can be obtained. When the laser is used as a cutting tool 35, this cutting tool 35 may merely be used.

Figure 51D:
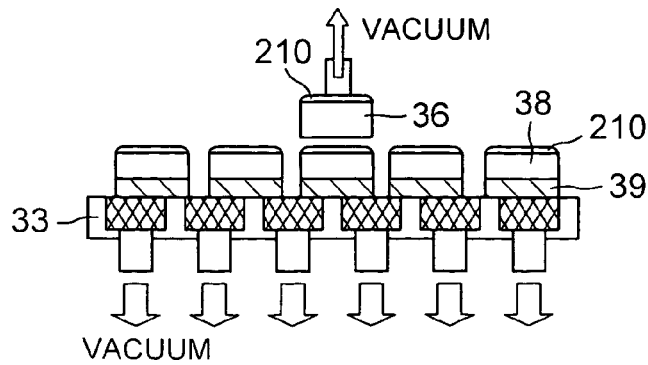

Subsequently, each of the separated semiconductor chips 38 starts to be picked up from the wafer sucking section. Shortly after the start of pickup, each of the semiconductor chips 38 is picked up only by suction force using the suction collet 36 (FIG. 51D). Each of the semiconductor chips 38 picked up is bonded to the leadframe or the like.

Figure 52A:
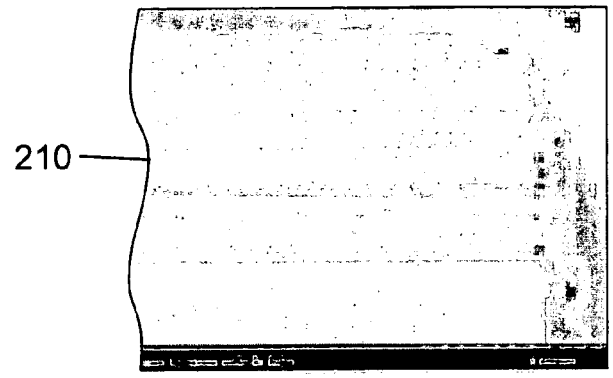
FIG. 52A to FIG. 52D and FIG. 53 are schematic views of a comparative example.
Figure 52B:
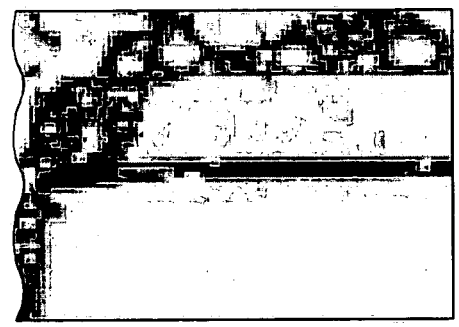
Figure 52C:
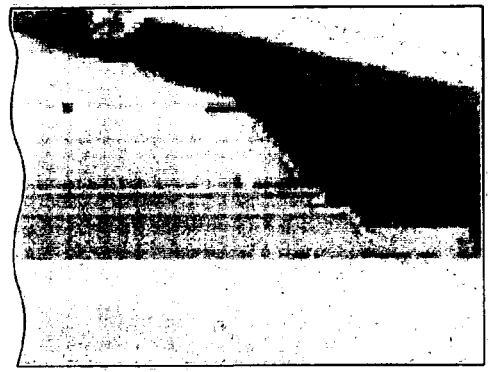
Figure 52D:
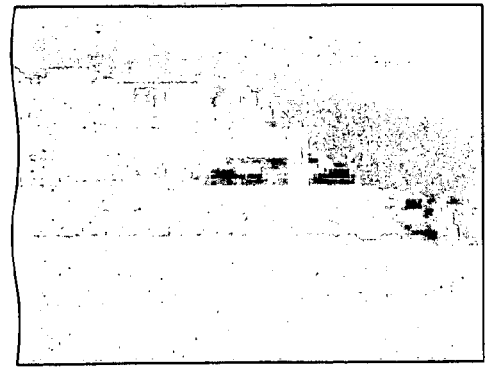
Figure 53:
Figure 54:
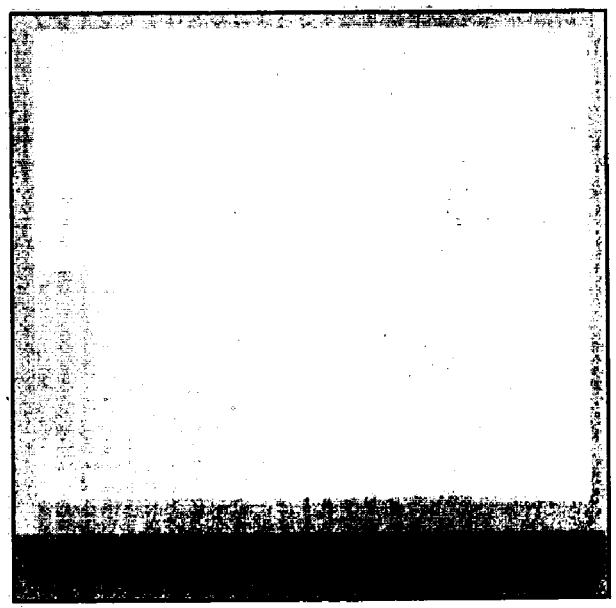
FIG. 54 is a schematic view showing effects of an eighth embodiment of the invention.

As described above, according to this embodiment, it is possible to obtain the semiconductor device which prevents the cracks and chipping mentioned above, and which has the low dielectric constant insulation film that fuses to be fixed on the sealing resin in the element formation area of each of the semiconductor chips with higher adhesiveness. Effects of this embodiment will be described referring to FIGS. 52A to FIG. 54. FIG. 52A to FIG. 52D and FIG. 53 are schematic views of a comparative example, and FIG. 54 is a schematic view showing effects of the present embodiment. FIG. 52A is an enlarged end portion view of a conventional semiconductor chip formed from the semiconductor wafer by use of a blade, and FIG. 52B is an enlarged end portion view after a thermal cycle test (hereinafter simply referred to as TCT) is performed on the chip of FIG. 52A 500 times. Moreover, FIG. 52C is an enlarged end portion view of the conventional semiconductor chip formed from the semiconductor wafer by use of the laser, and FIG. 52D is an enlarged end portion view after the TCT is similarly performed on the chip of FIG. 52C 500 times. It has been found out that when a blade is used, a number of bubbles are produced after the TCT as shown in FIG. 52B even if a favorable condition has been presented immediately after the cutting as shown in FIG. 52A, and a number of minute cracks are present. When the laser is used, no abnormalities are shown after the TCT, but as shown in plan views of FIG. 52D and FIG. 53, destruction of the low dielectric constant insulation film has been confirmed. With fusing process of the present embodiment, the satisfactory low dielectric constant insulation film can be confirmed with no peeling as shown in a plan view of FIG. 54.

While some embodiments of the present invention have been described above, the present invention is not limited to these embodiments and can be variously modified within the scope thereof. Moreover, these embodiments include various stages of the invention, and various inventions can be extracted by appropriate combinations of subject matters which have been disclosed hereinbefore. For example, it has been described in the eighth embodiment that, the semiconductor wafer has been beforehand broken to be separated into the semiconductor chips, and the PSA tape 34 covers the entire element formation surface, and the adhesive layer 39 is formed on the entire rear surface. However, the process of fusing the low dielectric constant insulation film is not limited to this form, and application is naturally possible also to a case in which the adhesive layer is formed on the rear surface of each of the semiconductor chips, and thus the adhesive layer does not need to be cut. Moreover, even when the semiconductor wafer has not yet been broken into the semiconductor chips, the above-mentioned process of fusing the low dielectric constant insulation film can be applied after or in parallel with the process of breaking the semiconductor wafer into pieces.

What is claimed is:

1. A semiconductor manufacturing apparatus comprising:
a peeling mechanism to peel a pressure sensitive adhesive (PSA) tape from a semiconductor wafer, the semiconductor wafer having an element formation surface to form an element thereon, and a rear surface opposite to the element formation surface, and an adhesive layer formed on the entire rear surface, and a sealing resin formed on the element formation surface and a low dielectric constant insulation film formed on the sealing resin,
the PSA tape adhering to the element formation surface of the semiconductor wafer via the sealing resin and the low dielectric constant insulation film,
wherein said peeling mechanism has a sucking section which has a porous member to hold the semiconductor wafer and a cutting device to cut the adhesive layer, said porous member being segmented into at least two sucking areas in a direction in which the PSA tape is peeled; and
a heating device to fuse at least part of the low dielectric constant insulation film and the sealing resin so as to fix the low dielectric constant insulation film on the sealing resin,
wherein said heating device fuses at least part of the low dielectric constant insulation film and the sealing resin by applying laser to a peripheral edge of the semiconductor chip with an incidence angle of 20° to 40°.

2. A semiconductor manufacturing apparatus comprising:
a peeling mechanism to peel a pressure sensitive adhesive (PSA) tape from a semiconductor wafer which has an element formation surface to form an element thereon and an adhesive layer formed on the element formation surface, the PSA tape adhering to the element formation surface of the semiconductor wafer via the adhesive layer;
wherein said peeling mechanism has a sucking section with a porous member to hold the semiconductor wafer by suction and has a cutting device to cut the semiconductor wafer into semiconductor chips together with the adhesive layer, said porous member being segmented into at least two sucking areas in a direction in which the PSA tape is peeled.

3. A semiconductor manufacturing apparatus comprising:
a peeling mechanism to peel a pressure sensitive adhesive (PSA) tape from a semiconductor wafer which has an element formation surface to form an element thereon and an adhesive layer formed on the entire element formation surface and which are broken to be separated into semiconductor chips, the PSA tape adhering to the element formation surface of the semiconductor wafer via the adhesive layer;
wherein said peeling mechanism has a sucking section which has a porous member to hold the semiconductor wafer by suction and has a cutting device to cut the adhesive layer, said porous member being segmented into at least two sucking areas in a direction in which the PSA tape is peeled.

4. A semiconductor manufacturing apparatus comprising:
a peeling mechanism to peel a pressure sensitive adhesive (PSA) tape from a semiconductor wafer which has an element formation surface to form an element thereon, the PSA tape adhering to the element formation surface of the semiconductor wafer;
wherein said peeling mechanism has a sucking section with a porous member to hold the semiconductor wafer and has a cutting device to cut the semiconductor wafer into semiconductor chips, said porous member being segmented into at least two sucking areas in a direction in which the PSA tape is peeled, the semiconductor wafer being held by suction through at least two suction paths in association with the sucking areas of the porous member, said suction paths being alternatively switched when part of the PSA tape corresponding to adjacent sucking areas of said porous member is peeled off near the adjacent sucking area for next peeling in the direction in which the PSA tape is peeled.

5. A method of manufacturing a semiconductor device comprising:
peeling a pressure sensitive adhesive (PSA) tape from a semiconductor wafer constituted by a plurality of semiconductor chips which are separated therefrom, the semiconductor wafer having an element formation surface to form an element thereon and a rear surface opposite to the element formation surface, the PSA tape adhering to the element formation surface of the semiconductor wafer, each of the semiconductor chips having an adhesive layer formed on the rear surface thereof;
wherein said peeling of the PSA tape includes holding the semiconductor wafer via a porous member segmented into at least two sucking areas in a direction in which the PSA tape is peeled, by suction through at least two suction paths in association with the sucking areas of the porous member, said suction paths being alternatively switched when part of the PSA tape corresponding to adjacent sucking areas of said porous member is peeled off near the adjacent sucking area for next peeling in the direction in which the PSA tape is peeled.

6. The method of manufacturing a semiconductor device according to claim 5,
wherein a plurality of through-holes are provided on the porous member.

7. The method of manufacturing a semiconductor device according to claim 5, which further comprises inserting a plate between the sucking areas of the porous member and the semiconductor wafer separated into semiconductor chips, the plate having suction holes corresponding to the semiconductor chips, respectively.

8. The method of manufacturing a semiconductor device according to claim 5, which further comprises sucking to pick up each semiconductor chip with a suction collet after the PSA tape is peeled.

9. A method of manufacturing a semiconductor device comprising:
  peeling a pressure sensitive adhesive (PSA) tape from a semiconductor wafer which is separated into semiconductor chips, the semiconductor wafer having an element formation surface to form an element thereon, a rear surface opposite to the element formation surface and an adhesive layer formed on the entire rear surface, the PSA tape adhering to the element formation surface of the semiconductor wafer; and
  cutting the adhesive layer so that the adhesive layer is separated for each semiconductor chip after the PSA tape is peeled;
  wherein said peeling of the PSA tape includes holding the semiconductor wafer via a porous member segmented into at least two sucking areas in a direction in which the PSA tape is peeled, by suction through at least two suction paths in association with the sucking areas of the porous member, respectively, said suction paths being alternatively switched when part of the PSA tape corresponding to adjacent sucking areas of the porous member is peeled off near the adjacent sucking area for next peeling in the direction in which the PSA tape is peeled; and
  said cutting of the adhesive layer is implemented in parallel to switching between said at least two suction paths in response to the state in which the adhesive layer is cut.

10. A method of manufacturing a semiconductor device comprising:
  peeling a pressure sensitive adhesive (PSA) tape from a semiconductor wafer, the semiconductor wafer having an element formation surface to form an element thereon, a rear surface opposite to the element formation surface and an adhesive layer formed on the entire rear surface, the PSA tape adhering to the element formation surface of the semiconductor wafer; and
  cutting the semiconductor wafer into semiconductor chips together with the adhesive layer after the PSA tape is peeled;
  wherein said peeling of the PSA tape includes holding the semiconductor wafer via a porous member segmented into at least two sucking areas in a direction in which the PSA tape is peeled, by suction through at least two suction paths in association with the sucking areas of the porous member, respectively, said suction paths being alternatively switched therebetween when part of the PSA tape corresponding to adjacent sucking areas of the porous member is peeled off near the adjacent sucking area for next peeling in the direction in which the PSA tape is peeled; and
  said cutting of the semiconductor wafer and the adhesive layer is implemented in parallel to switching between said at least two suction paths in response to the state in which the semiconductor wafer and the adhesive layer are cut.

11. The method of manufacturing a semiconductor device according to claim 9,
  wherein the semiconductor wafer further has a sealing resin formed on the element formation surface and a low dielectric constant insulation film formed on the sealing resin,
  the PSA tape adheres to the element formation surface to the semiconductor wafer via the sealing resin and the low dielectric constant insulation film, and
  said method of manufacturing a semiconductor device further comprises fusing at least part of the low dielectric constant insulation film and the sealing resin so as to fix the low dielectric constant insulation film on the sealing resin.

12. A method of manufacturing a semiconductor device comprising:
  peeling a pressure sensitive adhesive (PSA) tape from a semiconductor wafer, the semiconductor wafer having an element formation surface to form an element thereon and an adhesive layer formed on the element formation surface, the semiconductor wafer having been broken to be separated into semiconductor chips; and
  cutting the adhesive layer so that the adhesive layer is separated for each semiconductor chip after peeling the PSA tape;
  wherein said peeling of the PSA tape includes holding the semiconductor wafer via a porous member segmented into at least two sucking areas in a direction in which the PSA tape is peeled, by suction through at least two suction paths in association with the sucking areas of the porous member, respectively, said suction paths being alternatively switched when part of the PSA tape corresponding to adjacent sucking areas of the porous member is peeled off near the adjacent sucking area for next peeling in the direction in which the PSA tape is peeled, and
  said cutting of the adhesive layer is implemented in parallel to switching between said at least two suction paths in response to the state in which the adhesive layer is cut.

13. A method of manufacturing a semiconductor device comprising:
  peeling a pressure sensitive adhesive (PSA) tape from a semiconductor wafer, the semiconductor wafer having an element formation surface to form an element thereon and an adhesive layer formed on the element formation surface, the PSA tape adhering to the element formation surface of the semiconductor wafer via the adhesive layer; and
  cutting the semiconductor wafer into semiconductor chips together with the adhesive layer after the PSA tape is peeled;
  wherein said peeling of the PSA tape includes holding the semiconductor wafer via a porous member segmented into at least two sucking areas in a direction in which the PSA tape is peeled, by suction through at least two suction paths in association with the sucking areas of the porous member, respectively, said suction paths being alternatively switched when part of the PSA tape corresponding to adjacent sucking areas of the porous member is peeled off near the adjacent sucking area for next peeling in the direction in which the PSA tape is peeled; and
  said cutting of the semiconductor wafer and the adhesive layer is implemented in parallel to switching between said at least two suction paths in response to the state in which the semiconductor wafer and the adhesive layer are cut.

14. A method of manufacturing a semiconductor device comprising:
- peeling a pressure sensitive adhesive (PSA) tape from a semiconductor wafer, the PSA tape adhering to the semiconductor wafer; and
- cutting the semiconductor wafer into semiconductor chips after the PSA tape is peeled;
- wherein said peeling of the PSA tape includes holding the semiconductor wafer via a porous member segmented into at least two sucking areas in a direction in which the PSA tape is peeled, by suction through at least two suction paths in association with the sucking areas of the porous member, said suction paths being alternatively switched therebetween when part of the PSA tape corresponding to adjacent sucking areas of the porous member is peeled off near the adjacent sucking area for next peeling in the direction in which the PSA tape is peeled; and
- said cutting of the semiconductor wafer is implemented in parallel to switching between said at least two suction paths in response to the state in which the semiconductor wafer is cut.

* * * * *